US012588366B2

(12) United States Patent
Lee et al.

(10) Patent No.: US 12,588,366 B2
(45) Date of Patent: Mar. 24, 2026

(54) DISPLAY DEVICE AND METHOD OF PROVIDING DISPLAY DEVICE

(71) Applicant: Samsung Display Co., LTD., Yongin-si (KR)

(72) Inventors: Jaehun Lee, Seongnam-si (KR); Hye Sun Kim, Goyang-si (KR); Junho Sim, Hwaseong-si (KR); Sanghyun Lee, Hwaseong-si (KR); Yang-Ho Jung, Seoul (KR); Pil Soon Hong, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 819 days.

(21) Appl. No.: 17/891,261

(22) Filed: Aug. 19, 2022

(65) Prior Publication Data

US 2023/0135679 A1    May 4, 2023

(30) Foreign Application Priority Data

Oct. 29, 2021    (KR) ........................ 10-2021-0146833

(51) Int. Cl.
H10K 59/122        (2023.01)
H10K 50/84          (2023.01)
(Continued)

(52) U.S. Cl.
CPC ........... H10K 59/122 (2023.02); H10K 50/84 (2023.02); H10K 50/865 (2023.02); H10K 71/00 (2023.02); *H10K 59/1201* (2023.02)

(58) Field of Classification Search
None
See application file for complete search history.

(56) References Cited

U.S. PATENT DOCUMENTS

2018/0219171 A1    8/2018  Kim et al.
2018/0366524 A1*  12/2018  Bang .................... H10K 50/822
(Continued)

FOREIGN PATENT DOCUMENTS

CN        108364993 A      8/2018
CN        116367616 A  *  6/2023   ......... H01L 27/3246
(Continued)

OTHER PUBLICATIONS

European Search Report for European Patent Application No. 22203723.6 dated Mar. 28, 2023.
(Continued)

*Primary Examiner* — Michael Lebentritt
(74) *Attorney, Agent, or Firm* — CANTOR COLBURN LLP

(57)        ABSTRACT

A display device includes a display area including a display element including a pixel electrode and a driving element connected to the display element, a planarization layer on the driving element, and a pixel defining layer on the planarization layer and defining an opening corresponding to the pixel electrode of the display element. The pixel defining layer includes a bank portion defining the opening and extending from the pixel electrode, and including a flat portion and a first protrusion which protrudes from an upper surface of the flat portion and is adjacent to the pixel electrode, and a second protrusion which protrudes from the upper surface of the flat portion of the bank portion and is further from the opening than the first protrusion.

19 Claims, 18 Drawing Sheets

(51) Int. Cl.

| | |
|---|---|
| *H10K 50/86* | (2023.01) |
| *H10K 59/12* | (2023.01) |
| *H10K 71/00* | (2023.01) |

(56) References Cited

U.S. PATENT DOCUMENTS

| | | | | |
|---|---|---|---|---|
| 2020/0168823 | A1 | 5/2020 | Kim | |
| 2020/0235172 | A1 | 7/2020 | Lee et al. | |
| 2020/0365776 | A1 | 11/2020 | Sim et al. | |
| 2020/0365833 | A1 | 11/2020 | Joo et al. | |
| 2021/0066643 | A1 | 3/2021 | Choi et al. | |
| 2021/0217839 | A1 | 7/2021 | Choi et al. | |
| 2022/0208952 | A1* | 6/2022 | Shin | H10K 59/131 |
| 2023/0209881 | A1* | 6/2023 | Kim | H10K 59/873 |
| | | | | 257/211 |
| 2023/0217774 | A1* | 7/2023 | Ji | H10K 59/879 |
| | | | | 257/40 |

FOREIGN PATENT DOCUMENTS

| | | | | | |
|---|---|---|---|---|---|
| EP | 4207322 | A1 * | 7/2023 | ........... | H01L 33/005 |
| KR | 100721955 | B1 | 5/2007 | | |
| KR | 1020180013207 | A | 2/2018 | | |
| KR | 20180089605 | A | 8/2018 | | |
| KR | 1020180138253 | A | 12/2018 | | |
| KR | 1020200032496 | A | 3/2020 | | |
| KR | 102118920 | B1 | 6/2020 | | |
| KR | 20200091059 | A | 7/2020 | | |
| KR | 20200133086 | A | 11/2020 | | |
| KR | 20210028799 | A | 3/2021 | | |
| KR | 1020210043792 | A | 4/2021 | | |
| KR | 1020220070135 | A | 5/2022 | | |

OTHER PUBLICATIONS

Korean Office Action for Korean Patent Application No. KR 10-2021-0146833 dated Sep. 19, 2025.

* cited by examiner

F I G. 5
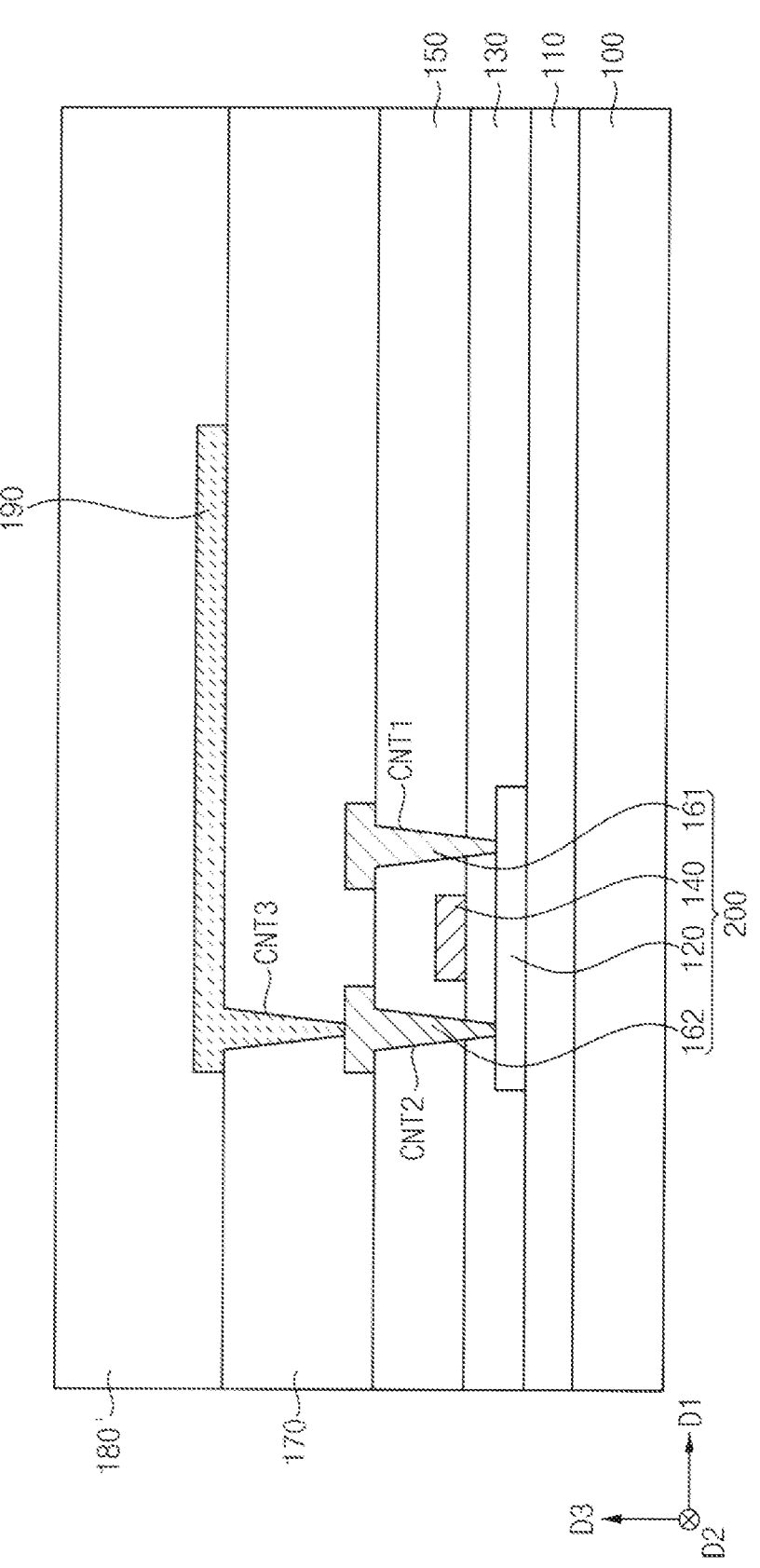

600

601
602a
603
602b

F I G . 8
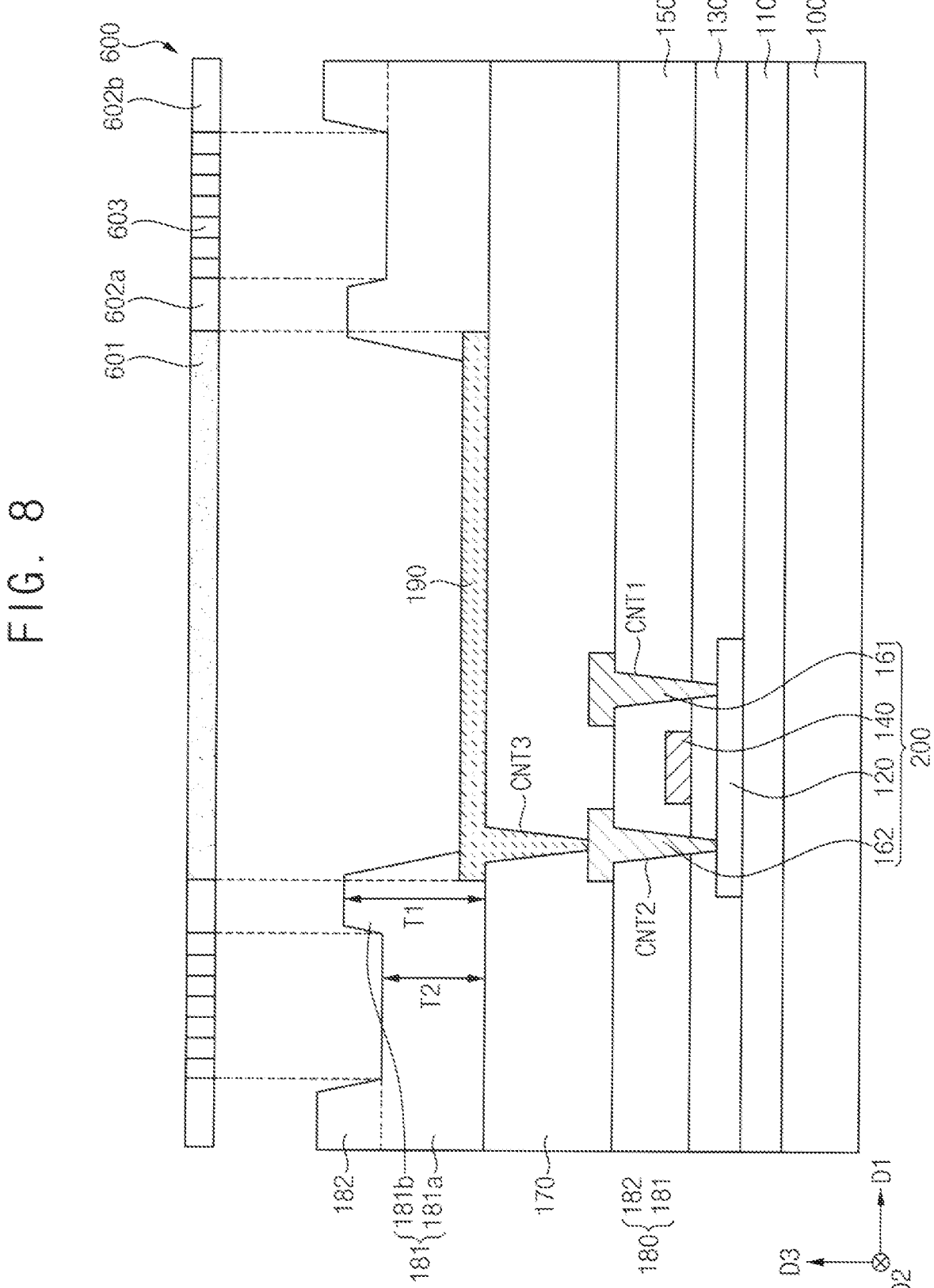

CNT1
CNT3
CNT2

DISPLAY DEVICE AND METHOD OF PROVIDING DISPLAY DEVICE

This application claims priority to Korean Patent Application No. 10-2021-0146833, filed on Oct. 29, 2021, and all the benefits accruing therefrom under 35 U.S.C. § 119, which is hereby incorporated by reference for all purposes as if fully set forth herein.

BACKGROUND

1. Field

Embodiments provide generally to a display device. More particularly, embodiments relate to the display device that provides visual information and method of manufacturing (or providing) the display device.

2. Description of the Related Art

A flat panel display device is used as a display device that replaces a cathode ray tube display, due to characteristics such as light weight and thinness. Representative examples of such flat panel display devices include a liquid crystal display device and an organic light emitting display device.

The organic light emitting display device may include a pixel defining layer defining a pixel and a spacer which is disposed on the pixel defining layer. The pixel defining layer and the spacer may include different materials.

SUMMARY

When a pixel defining layer and a spacer in a display deice include different materials from each other, a method of providing the display device may include adding masks and process steps.

Embodiment provides a display device with improved display quality.

Embodiment provides a method of manufacturing (or providing) the display device.

A display device according to an embodiment includes a substrate including a display area and a peripheral area, a driving element in the display area on the substrate, a pixel electrode on the driving element and connected to the driving element, a planarization layer on the driving element, and a pixel defining layer including a bank portion including a flat portion on the planarization layer and a protrusion portion protruding in a thickness direction from an upper surface of the flat portion adjacent to the pixel electrode, the bank portion having an opening exposing a portion of the pixel electrode, and a spacer portion protruding in the thickness direction from an upper surface of the bank portion.

In an embodiment, an upper surface of the spacer portion may be located at a level higher than an upper surface of the protrusion portion in a cross-sectional view.

In an embodiment, the pixel defining layer may further include a black pigment.

In an embodiment, the pixel defining layer may include a negative photosensitive material.

In an embodiment, the planarization layer may include an organic insulating material.

In an embodiment, the display device may further include a light emitting layer on the pixel electrode, and a common electrode on the pixel defining layer and the light emitting layer.

In an embodiment, the display device may further include an encapsulation structure on the common electrode and including an organic layer and an inorganic layer, a light blocking layer on the encapsulation structure and overlapping the pixel defining layer, and a reflection control layer on the encapsulation structure and covering the light blocking layer.

A display device according to an embodiment includes a substrate including a display area and a peripheral area, a driving element in the display area on the substrate, a pixel electrode on the driving element and connected to the driving element, a planarization layer on the driving element and having a groove adjacent to the pixel electrode, and a pixel defining layer including a bank portion on the planarization layer, filling the groove, and having an opening exposing a portion of the pixel electrode, and a spacer portion protruding in a thickness direction from an upper surface of the bank portion.

In an embodiment, the bank portion overlapping the groove may have a flat upper surface.

In an embodiment, the pixel defining layer may include a black pigment.

In an embodiment, the pixel defining layer may include a negative photosensitive material.

In an embodiment, the planarization layer may include an organic insulating material.

In an embodiment, the bank portion may include a flat portion on the planarization layer and a protrusion portion protruding in the thickness direction from an upper surface of the flat portion overlapping the groove.

In an embodiment, the display device may further include a light emitting layer on the pixel electrode and a common electrode on the pixel defining layer and the light emitting layer.

A method of manufacturing (or providing) a display device according to an embodiment includes forming (or providing) a driving element in a display area on a substrate including the display area and a peripheral area, forming a planarization layer on the driving element, forming a pixel electrode connected to the driving element on the driving element, applying a photosensitive organic layer on the planarization layer, positioning a mask divided into a light blocking portion, a first light transmitting portion surrounding the light blocking portion, a semi-transmitting portion surrounding the first light transmitting portion, and a second light transmitting portion surrounding the semi-transmitting portion on the photosensitive organic layer, and forming a pixel defining layer including a bank portion including a flat portion on the planarization layer and a protrusion protruding in a thickness direction from an upper surface of the flat portion adjacent to the pixel electrode, the bank portion having an opening exposing a portion of the pixel electrode, and a spacer portion protruding in the thickness direction from an upper surface of the bank portion, by exposing and developing the photosensitive organic layer through the mask.

In an embodiment, the forming of the pixel defining layer may include forming the opening by removing all of the photosensitive organic layer corresponding to the light blocking portion of the mask, forming the protrusion portion by leaving a thickness portion of the photosensitive organic layer corresponding to the first light transmitting portion of the mask, forming the spacer portion by leaving a thickness portion of the photosensitive organic layer corresponding to the second light transmitting portion of the mask, and exposing an upper surface of the flat portion by removing a thickness portion of the photosensitive organic layer corresponding to the semi-transmitting portion of the mask.

In an embodiment, each of the first and second light transmitting portions may transmit all light, the semi-transmitting portion may transmit a portion of light, and the light blocking portion may block all light.

In an embodiment, an upper surface of the spacer portion may be located at a level higher than an upper surface of the protrusion portion in a cross-sectional view.

In an embodiment, the photosensitive organic layer may include a black pigment.

In an embodiment, the photosensitive organic layer may include a negative photosensitive material.

In a display device according to an embodiment of the invention, a pixel defining layer may include a bank portion on a planarization layer and a spacer portion which protrudes in the thickness direction from an upper surface of the bank portion. The bank portion may include a flat portion on the planarization layer and a protrusion portion which protrudes in the thickness direction from an upper surface of the flat portion adjacent to the pixel electrode. Accordingly, when a halftone mask is used in a photolithography process of forming the pixel defining layer including the bank portion and the spacer portion, critical dimension (CD) distribution of the pixel defining layer may be improved. In addition, reflectivity due to external light incident into the display device may be reduced.

BRIEF DESCRIPTION OF THE DRAWINGS

Illustrative, non-limiting embodiments will be more clearly understood from the following detailed description in conjunction with the accompanying drawings.

FIGS. 4, 5, 6, 7, 8, and 9 are cross-sectional views illustrating a method of manufacturing (or providing) the display device of FIG. 3.

FIG. 10 is a cross-sectional view illustrating a display device according to an embodiment.

FIGS. 11, 12, 13, 14, and 15 are cross-sectional views illustrating a method of manufacturing (or providing) the display device of FIG. 10.

DETAILED DESCRIPTION

Figure 1:
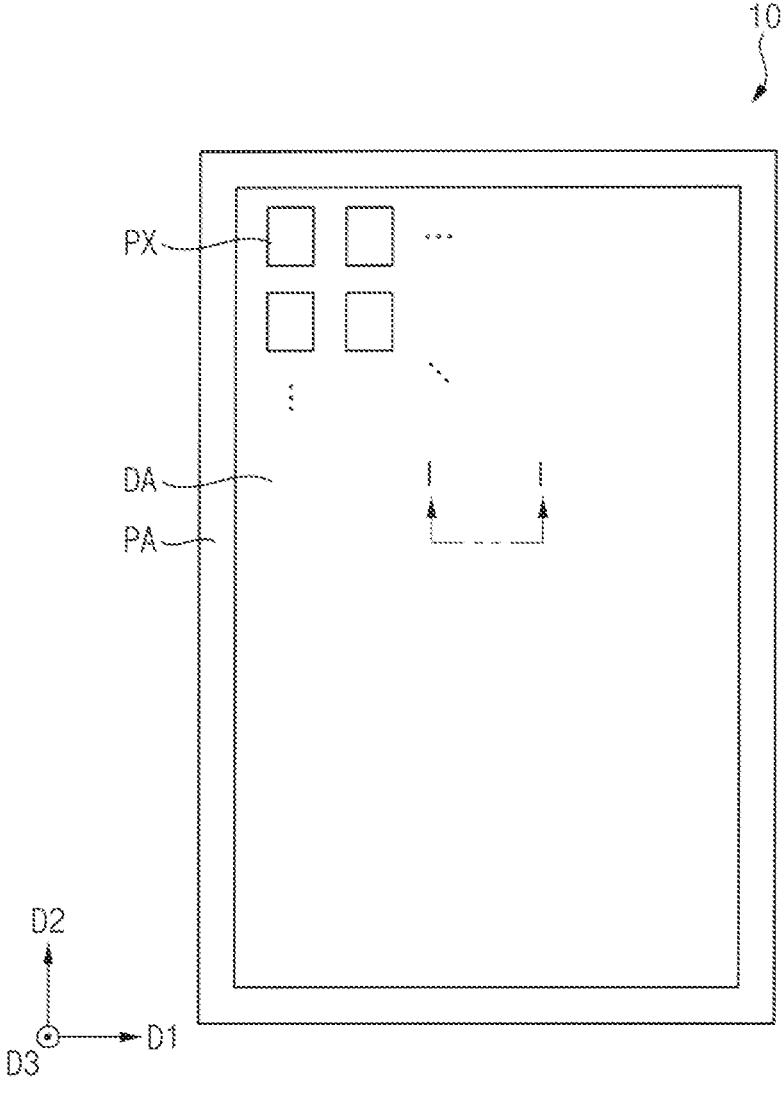
FIG. 1 is a plan view illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

Hereinafter, embodiments of the present disclosure will be explained in detail with reference to the accompanying drawings. The same reference numerals are used for the same components in the drawings, and redundant descriptions of the same components will be omitted. As used herein, a same reference number may indicate a singular element or a plurality of the element. For example, a reference number labeling a singular form of an element within the drawing figures may be used to reference a plurality of the singular element within the text of specification.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a plan view illustrating a display device 10 according to an embodiment.

Referring to FIG. 1, the display device 10 may include a display area DA and a peripheral area PA which is adjacent to the display area DA. The display area DA may be defined as an area at which an image is displayed, such as by generating light or adjusting transmittance of light provided from an external light source. The peripheral area PA may be defined as an area that does not display an image (e.g., non-display area). In addition, the peripheral area PA may surround at least a portion of the display area DA. In an embodiment, for example, the peripheral area PA may entirely surround the display area DA (e.g., may surround an entirety of the display area DA).

A pixel PX provided in plural including a plurality of pixels PX may be disposed in the display area DA. In an embodiment, for example, each of the pixels PX may include a driving element 200 200 (of FIG. 3), a light emitting element 300 (of FIG. 3), and the like.

One pixel PX may display a color, such as a predetermined basic color. In other words, one pixel PX may be a minimum unit which displays colors independent of other pixels PX. In an embodiment, for example, one pixel PX may display or emit light of any one of red, green, and blue colors.

The pixels PX may be arranged in a matrix form along a first direction D1 and a second direction D2 which intersects the first direction D1. In an embodiment, for example, the first direction D1 and the second direction D2 may be orthogonal to each other.

However, although the display device 10 of the invention is described as an organic light emitting display device (OLED), the configuration of the invention is not limited thereto.

In an embodiment, the display device 10 is a liquid crystal display device (LCD), a field emission display device (FED), a plasma display device (PDP), an electrophoretic display device (EPD). Hereinafter, an example in which the display device 10 of the invention includes the organic light emitting display device will be described.

Figure 2:
FIG. 2 is a cross-sectional view taken along line I-I' of FIG. 1.
Figure 2:
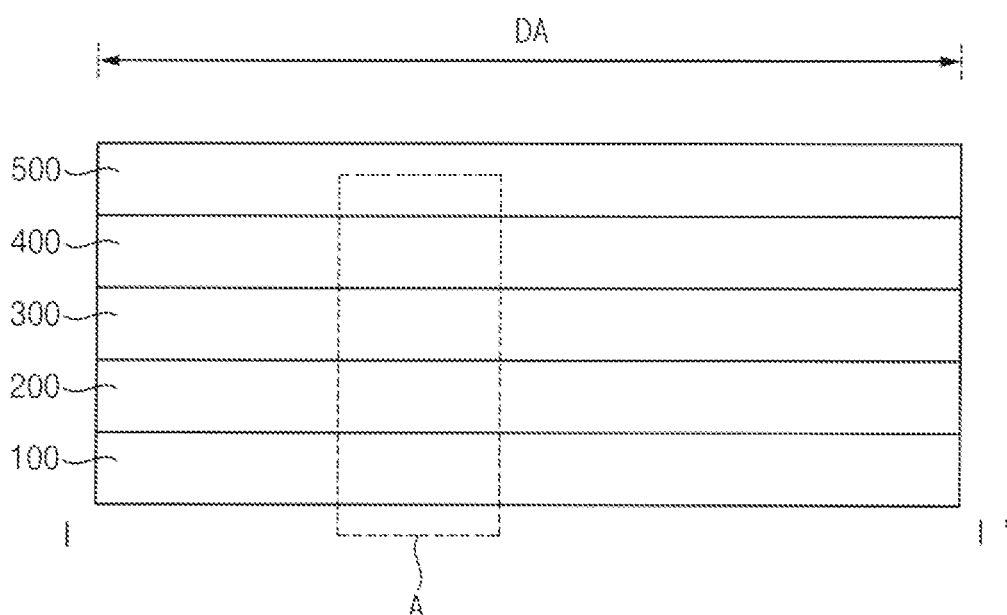
Figure 2:
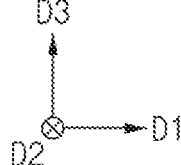
Figure 3:
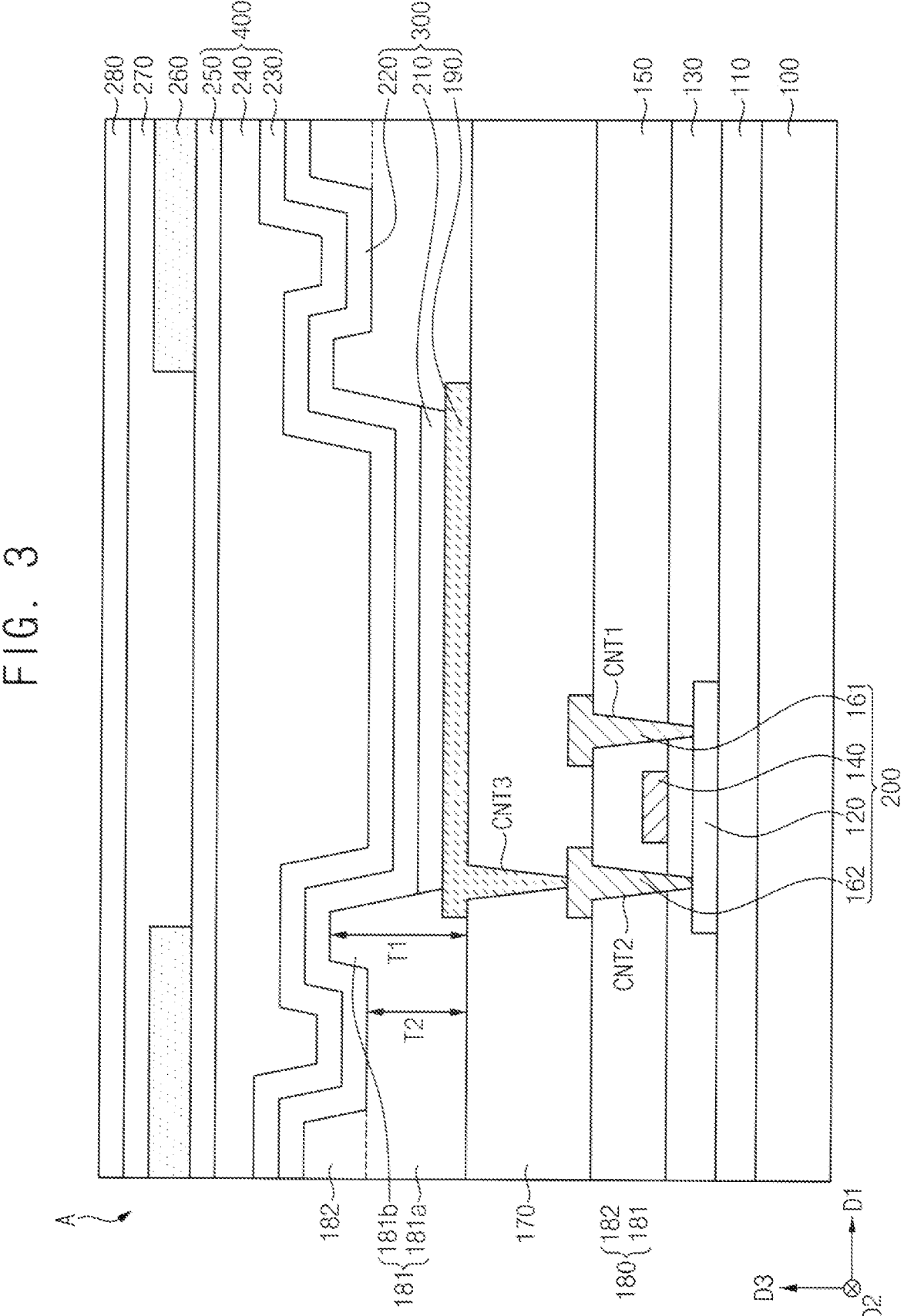
FIG. 3 is a cross-sectional view illustrating an enlarged area 'A' of FIG. 2.

FIG. 2 is a cross-sectional view taken along line I-I' of FIG. 1. FIG. 3 is a cross-sectional view illustrating an enlarged area 'A' of FIG. 2.

Referring to FIGS. 1, 2 and 3, the display device 10 according to an embodiment may include a substrate 100, a buffer layer 110, a gate insulating layer 130, a driving element 200 (e.g., a driving element layer), an interlayer insulating layer 150, a planarization layer 170, a light emitting element 300 (e.g., a light emitting element layer), a pixel defining layer 180, an encapsulation structure 400 (e.g., an encapsulation layer), a light blocking layer 260, a reflection control layer 270, an overcoat layer 280 and a window member 500.

Here, the driving element 200 may include an active layer 120, a gate electrode 140, a source electrode 161, and a drain electrode 162. The light emitting element 300 may include a pixel electrode 190 and a light emitting layer 210, and a common electrode 220. In addition, the encapsulation structure 400 may include a first inorganic encapsulation layer 230, an organic encapsulation layer 240, and a second inorganic encapsulation layer 250.

As described above, the display device 10 may include a display area DA and a peripheral area PA. As the display device 10 includes the display area DA and the peripheral area PA, the substrate 100 may also include the display area DA and the peripheral area PA. That is, various components or layers of the display device 10 may include a display area DA and a peripheral area PA corresponding to those described above.

The substrate 100 may include a transparent material or an opaque material. In an embodiment, for example, the substrate 100 may be formed of (or include) a transparent resin substrate. Examples of the transparent resin substrate may include a polyimide substrate. In this case, the polyimide substrate may include a first polyimide layer, a barrier film layer, a second polyimide layer, and the like. In an embodiment, the substrate 100 may include a quartz substrate, a synthetic quartz substrate, a calcium fluoride substrate, a fluorine-doped quartz substrate, a soda-lime glass substrate, a non-alkali glass substrate, and the like. These may be used alone or in combination with each other.

The buffer layer 110 may be disposed on the substrate 100. The buffer layer 110 may prevent (or reduce) diffusion of metal atoms or impurities from the substrate 100 to the driving element 200. In addition, when the surface of the substrate 100 is not uniform, the buffer layer 110 may serve to improve the flatness of the surface of the substrate 100. In an embodiment, for example, the buffer layer 110 may include silicon oxide, silicon nitride, and the like. These may be used alone or in combination with each other.

The active layer 120 may be disposed in the display area DA, on the buffer layer 110. The active layer 120 may include a metal oxide semiconductor, an inorganic semiconductor (e.g., amorphous silicon, polysilicon), or an organic semiconductor. The active layer 120 may include a source region, a drain region, and a channel region which is positioned between the source region and the drain region.

The gate insulating layer 130 may be disposed on the buffer layer 110. The gate insulating layer 130 may cover the active layer 120. The gate insulating layer 130 may sufficiently cover the active layer 120 on the buffer layer 110, and may have a substantially flat upper surface without creating a step difference around the active layer 120. The gate insulating layer 130 may cover the active layer 120 on the buffer layer 110, and may be disposed along a profile of the active layer 120 with a uniform thickness. In an embodiment, for example, the gate insulating layer 130 may include an inorganic insulating material.

Examples of the inorganic insulating material that can be used as the gate insulating layer 130 may include silicon oxide ($SiO_x$), silicon nitride ($SiN_x$), silicon carbide ($SiC_x$), silicon oxynitride ($SiO_xN_y$), silicon oxycarbide ($SiO_xC_y$), and the like. These may be used alone or in combination with each other.

The gate electrode 140 may be disposed in the display area DA, on the gate insulating layer 130. The gate electrode 140 may overlap the channel region of the active layer 120. In an embodiment, for example, the gate electrode 140 may include a metal, an alloy, a metal nitride, a conductive metal oxide, a transparent conductive material, and the like. These may be used alone or in combination with each other.

The interlayer insulating layer 150 may be disposed on the gate insulating layer 130. The interlayer insulating layer 150 may cover the gate electrode 140. The interlayer insulating layer 150 may sufficiently cover the gate electrode 140 on the gate insulating layer 130, and may have a substantially flat upper surface without generating a step difference around the gate electrode 140. The interlayer insulating layer 150 may cover the gate electrode 140 on the gate insulating layer 130 and may be disposed along a profile of the gate electrode 140 with a uniform thickness. The interlayer insulating layer 150 may include an inorganic insulating material. Examples of the inorganic insulating material that can be used as the interlayer insulating layer 150 may include silicon oxide, silicon nitride, silicon carbide, and the like. These may be used alone or in combination with each other.

The source electrode 161 and the drain electrode 162 may be disposed in the display area DA, on the interlayer insulating layer 150. The source electrode 161 may be connected to the source region of the active layer 120 through a first contact hole CNT1 formed (or provided) by removing a first portion of the gate insulating layer 130 and the interlayer insulating layer 150 which corresponds to the source region. The drain electrode 162 may be connected to the drain region of the active layer 120 through a second contact hole CNT2 formed by removing a second portion of the gate insulating layer 130 and the interlayer insulating layer 150 which corresponds to the drain region. In an embodiment, for example, each of the source electrode 161 and the drain electrode 162 may include a metal, an alloy, a metal nitride, a conductive metal oxide, a transparent conductive material, and the like. These may be used alone or in combination with each other.

Accordingly, the driving element 200 including the active layer 120, the gate electrode 140, the source electrode 161, and the drain electrode 162 may be disposed in the display area DA, on the substrate 100.

The planarization layer 170 may be disposed on the interlayer insulating layer 150. The planarization layer 170 may sufficiently cover the source electrode 161 and the drain electrode 162. In an embodiment, for example, the planarization layer 170 may have a substantially flat upper surface, and a planarization process may be added to the planarization layer 170 to implement such the flat upper surface of the planarization layer 170.

The planarization layer 170 may include an inorganic insulating material or an organic insulating material. In an embodiment, the planarization layer 170 may include an organic insulating material. Examples of the organic insulating material that can be used as the planarization layer 170 may include photoresists, polyacrylic resins, polyimide resins, siloxane resins, acrylic resins, epoxy resins, and the like. These may be used alone or in combination with each other.

In an embodiment, the planarization layer 170 may have a multilayer structure including a first planarization layer including a substantially transparent siloxane-based resin, and a second planarization layer disposed on the first planarization layer and including a substantially transparent photosensitive polyimide (PSPI). That is, the first planarization layer and the second planarization layer may include different materials from each other.

The pixel electrode 190 may be disposed in the display area DA, on the planarization layer 170. The pixel electrode 190 may be connected to the drain electrode 162 through a third contact hole CNT3 formed by removing a portion of the planarization layer 170 which corresponds to the drain electrode 162. In an embodiment, for example, the pixel electrode 190 may include a metal, an alloy, a metal nitride, a conductive metal oxide, a transparent conductive material, and the like. These may be used alone or in combination with each other. In an embodiment, for example, the pixel electrode 190 may be an anode electrode as a first electrode of the light emitting element 300 (e.g., display element).

The pixel defining layer 180 may be disposed on the planarization layer 170 and the pixel electrode 190. The pixel defining layer 180 may include an inorganic insulating material or an organic insulating material. In an embodiment, the pixel defining layer 180 may include an organic insulating material. Examples of the organic insulating material that can be used for the pixel defining layer 180 may include polyacrylic resin, polyimide-based resin, acrylic resin, phenol resin, and the like. These may be used alone or in combination with each other. In an embodiment, for example, the pixel defining layer 180 may include a negative photosensitive material.

In an embodiment, the pixel defining layer 180 may further include a black pigment or a black dye having a high light absorption. In an embodiment, for example, carbon black or the like may be used as the black pigment or the black dye. However, the invention is not limited thereto.

In an embodiment, the pixel defining layer 180 may include a bank portion 181 and a spacer portion 182, disposed on the planarization layer 170. The bank portion 181 may define a pixel opening (e.g., a first opening) of the pixel defining layer 180 which exposes a portion of the pixel electrode 190 to outside the pixel defining layer 180. The spacer portion 182 protrudes in (or along) a thickness direction (e.g., a third direction D3) from an upper surface of the bank portion 181, to define a first protrusion of the pixel defining layer 180. An upper surface of an element may be furthest from the substrate 100 at a respective position along the substrate 100.

During a process of manufacturing (or providing) the display device 10, the spacer portion 182 may serve to support a mask layer from collapsing or sagging toward the substrate 100, when the light emitting layer 210 is formed. In an embodiment, for example, the spacer portion 182 may have any one of a truncated pyramid, a prism, a truncated cone, and a cylindrical shape.

The bank portion 181 and the spacer portion 182 may be integrally formed such as define a single body, through a photolithography process using a photosensitive material as a pixel defining layer material. That is, the bank portion 181 and the spacer portion 182 may include the same material as each other. However, the invention is not limited thereto. For example, the bank portion 181 and the spacer portion 182 may be formed separately from each other (e.g., in different processes) or may include different materials from each other.

In an embodiment, the bank portion 181 may include a flat portion 181a as a base portion disposed on the planarization layer 170 and closest thereto, and a protrusion portion 181b protruding in the thickness direction (e.g., the third direction D3) from an upper surface of the flat portion 181a at a location adjacent to the pixel electrode 190 in a direction along the planarization layer 170. The flat portion 181a includes an upper surface which is furthest from the planarization layer 170 and a lower surface which is closest to the planarization layer 170. The protrusion portion 181b may define a second protrusion of the pixel defining layer 180. Accordingly, the degree of crosslinking of the protrusion portion 181b of the bank portion 181 may be improved.

An upper surface of the spacer portion 182 and an upper surface of the protrusion portion 181*b* may be located at different levels from each other with respect to a reference such as the substrate 100. In an embodiment, the upper surface of the spacer portion 182 may be located at a higher level than the upper surface of the protrusion portion 181*b*, to be further from the substrate 100 than the upper surface of the protrusion portion 181*b*.

In an embodiment, a first thickness T1 of the pixel defining layer 180 taken from the upper surface of the planarization layer 170 to the upper surface of the protrusion portion 181*b*, may be greater than a second thickness T2 of the pixel defining layer 180 taken from the upper surface of the planarization layer 170 to the upper surface of the flat portion 181*a*. The second thickness T2 may correspond to or define the flat portion 181*a*.

The light emitting layer 210 may be disposed on the pixel electrode 190. The light emitting layer 210 may be disposed in the pixel opening of the bank portion 181. The light emitting layer 210 may be formed using at least one of light emitting materials that emit different color lights (e.g., red light, green light, blue light, and the like) according to sub-pixels of the display device 10.

The common electrode 220 may be disposed on the pixel defining layer 180 and the light emitting layer 210. The common electrode 220 may include a metal, an alloy, a metal nitride, a conductive metal oxide, a transparent conductive material, and the like. These may be used alone or in combination with each other. In an embodiment, for example, the common electrode 220 may be a cathode electrode.

Accordingly, the light emitting element 300 including the pixel electrode 190, the light emitting layer 210 and the common electrode 220 may be disposed in the display area DA, on the substrate 100.

The encapsulation structure 400 may be disposed on the common electrode 220. The encapsulation structure 400 may include at least one inorganic layer and at least one organic layer. In an embodiment, the encapsulation structure 400 may include the first inorganic encapsulation layer 230 disposed on the common electrode 220, the organic encapsulation layer 240 disposed on the first inorganic encapsulation layer 230, and the second inorganic encapsulation layer 250 disposed on the organic encapsulation layer 240.

The first inorganic encapsulation layer 230 may prevent the light emitting element 300 from being deteriorated due to penetration of moisture, oxygen, or the like. In addition, the first inorganic encapsulation layer 230 may also perform a function of protecting the light emitting element 300 from external impact. In an embodiment, for example, the first inorganic encapsulation layer 230 may include an inorganic insulating material having flexibility.

The organic encapsulation layer 240 may improve the flatness of the display device 10, and may protect the light emitting element 300 together with the first inorganic encapsulation layer 230. In an embodiment, for example, the organic encapsulation layer 240 may include an organic insulating material having flexibility.

The second inorganic encapsulation layer 250 together with the first inorganic encapsulation layer 230 may prevent the light emitting element 300 from being deteriorated due to penetration of moisture, oxygen, or the like. In addition, the second inorganic encapsulation layer 250 may protect the light emitting element 300 together with the first inorganic encapsulation layer 230 and the organic encapsulation layer 240 from external impact. In an embodiment, for example, the second inorganic encapsulation layer 250 may include an inorganic insulating material having flexibility.

A polarizing plate (not shown) may not be disposed on the encapsulation structure 400. That is, the display device 10 may not include the polarizing plate. Accordingly, the light efficiency of the display device 10 may be improved.

The light blocking layer 260 may be disposed on the encapsulation structure 400. Solid portions of the light blocking layer 260 may overlap solid portions of the pixel defining layer 180. Solid portions of the light blocking layer 260 may be disposed to define a light emission opening (e.g., a second opening) corresponding to the light emitting layer 210. Solid portions may define a respective opening therebetween. The light emission opening and the light emitting layer 210 may be each be provided in plural and respectively correspond to each other. The light blocking layer 260 may prevent visible rays of different colors implemented in the light emitting element 300 from abnormally mixing or affecting each other. In addition, the light blocking layer 260 may prevent the members of the driving element 200 from being damaged by external light.

The light blocking layer 260 may include a light blocking material. In an embodiment, for example, the light blocking layer 260 may include a black organic material mixed with a black pigment, chromium oxide, and the like. The color of the light blocking layer 260 is not limited to black, and the light blocking layer 260 may include pigments or dyes of other colors.

The reflection control layer 270 may be disposed on the encapsulation structure 400. The reflection control layer 270 may cover the light blocking layer 260. The reflection control layer 270 may pass only light of a specific wavelength, such as red light, green light, or blue light, from among the light emitted from the light emitting element 300, and may absorb light of remaining wavelengths other than the specific wavelength. In addition, the reflection control layer 270 may block light reflected by external light. In an embodiment, for example, the reflection control layer 270 may include an inorganic insulating material or an organic insulating material.

The overcoat layer 280 may be disposed on the reflection control layer 270. The overcoat layer 280 may prevent the reflection control layer 270 from being exposed to external moisture or air. In addition, the overcoat layer 280 may function as a planarizing layer. In an embodiment, for example, the overcoat layer 280 may include an inorganic insulating material or an organic insulating material.

In the display device 10 according to the embodiment of the invention, the pixel defining layer 180 may include the bank portion 181 disposed on the planarization layer 170 and the spacer portion 182 which protrudes in the thickness direction further than the upper surface of the bank portion 181, in a direction away from the substrate 100. The bank portion 181 may include the flat portion 181*a* disposed on the planarization layer 170 and the protrusion portion 181*b* which protrudes in the thickness direction from the upper surface of the flat portion 181*a* which is adjacent to the pixel electrode 190.

Accordingly, when a halftone mask is used in a photolithography process of forming the pixel defining layer 180 including the bank portion 181 and the spacer portion 182, the critical dimension (CD) of the pixel defining layer 180 may be improved. In addition, reflectivity due to external light incident into the display device 10 may be reduced.

Figure 6:
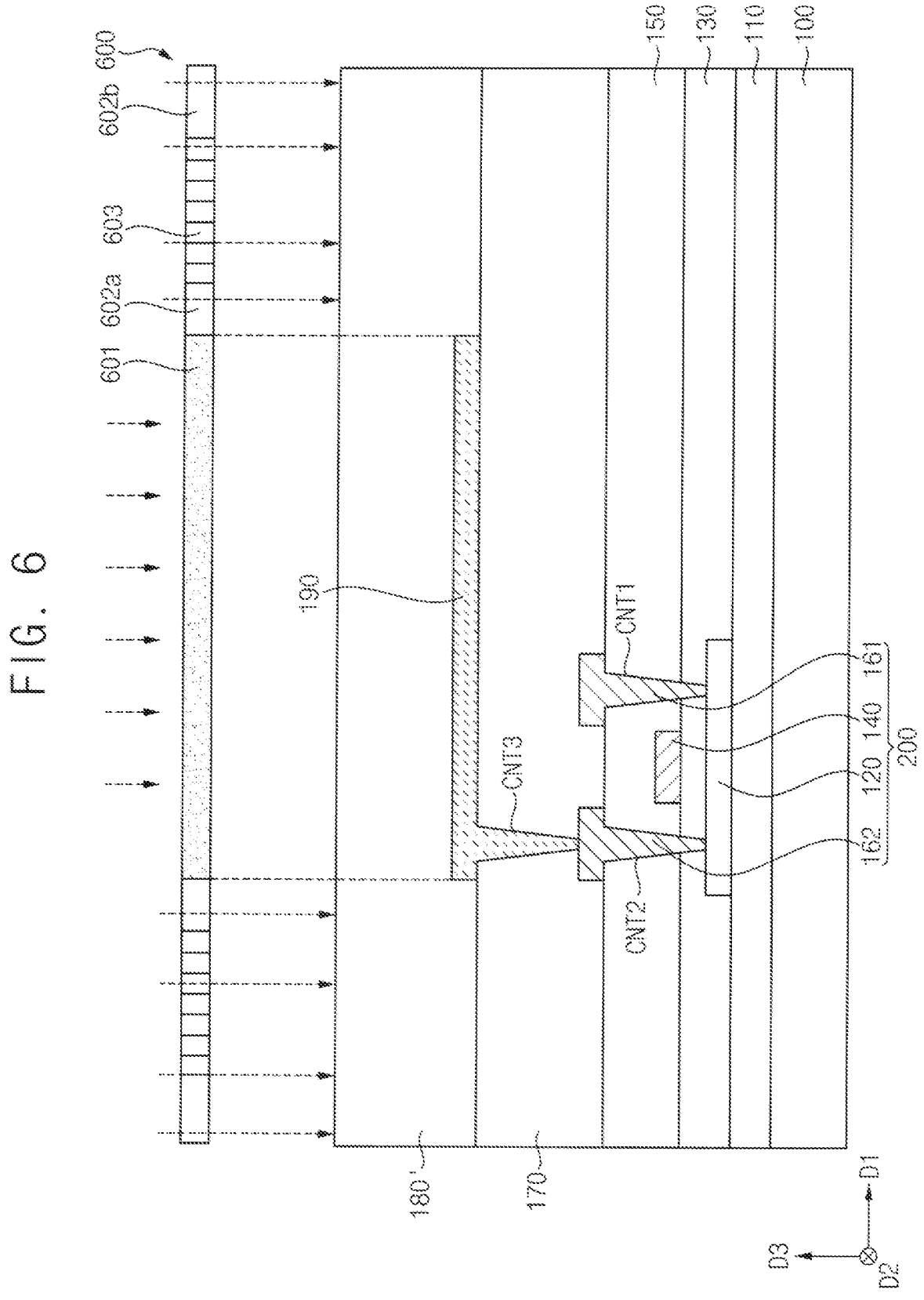
Figure 7:
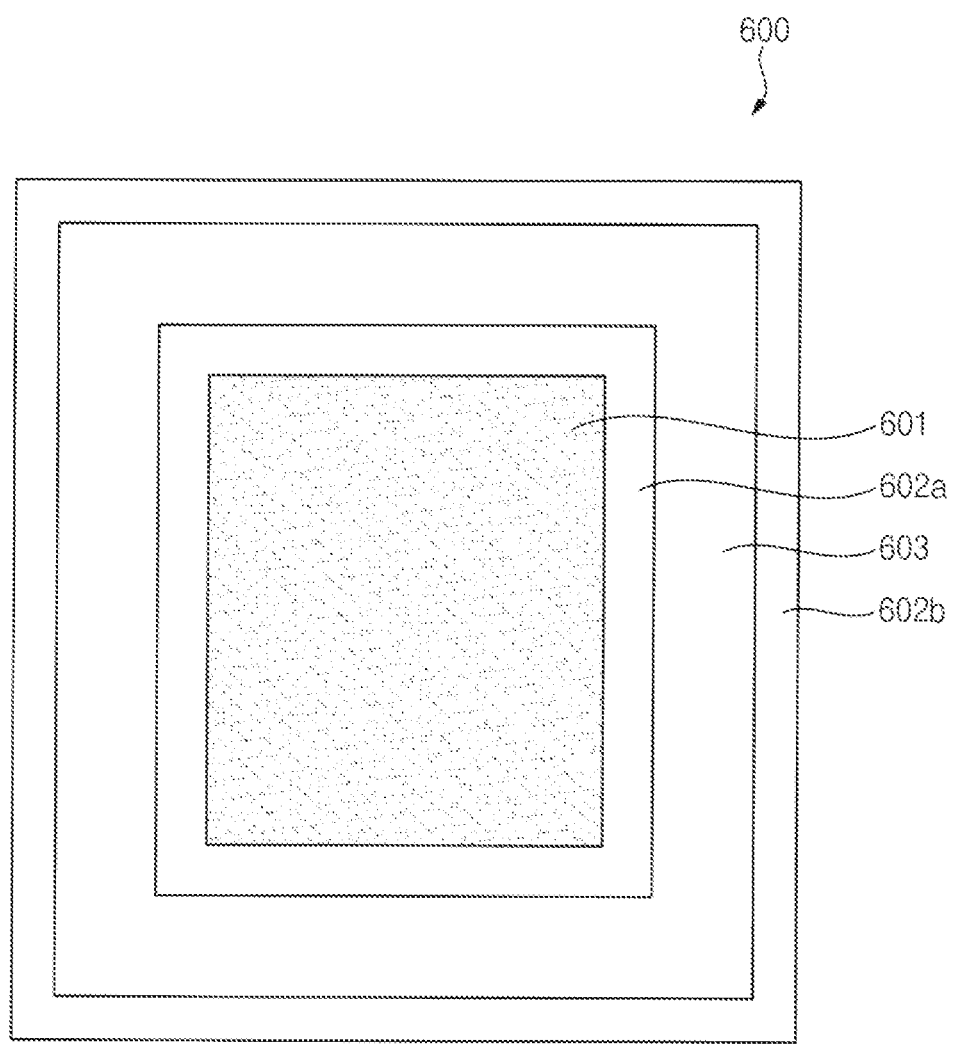
Figure 7:
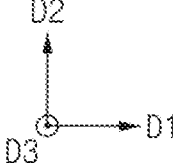

FIGS. 4, 5, 6, 7, 8, and 9 are views illustrating a method of manufacturing (or providing) the display device 10 of FIG. 3. FIG. 7 is a plan view illustrating a mask 600 of FIG. 6.

Figure 4:
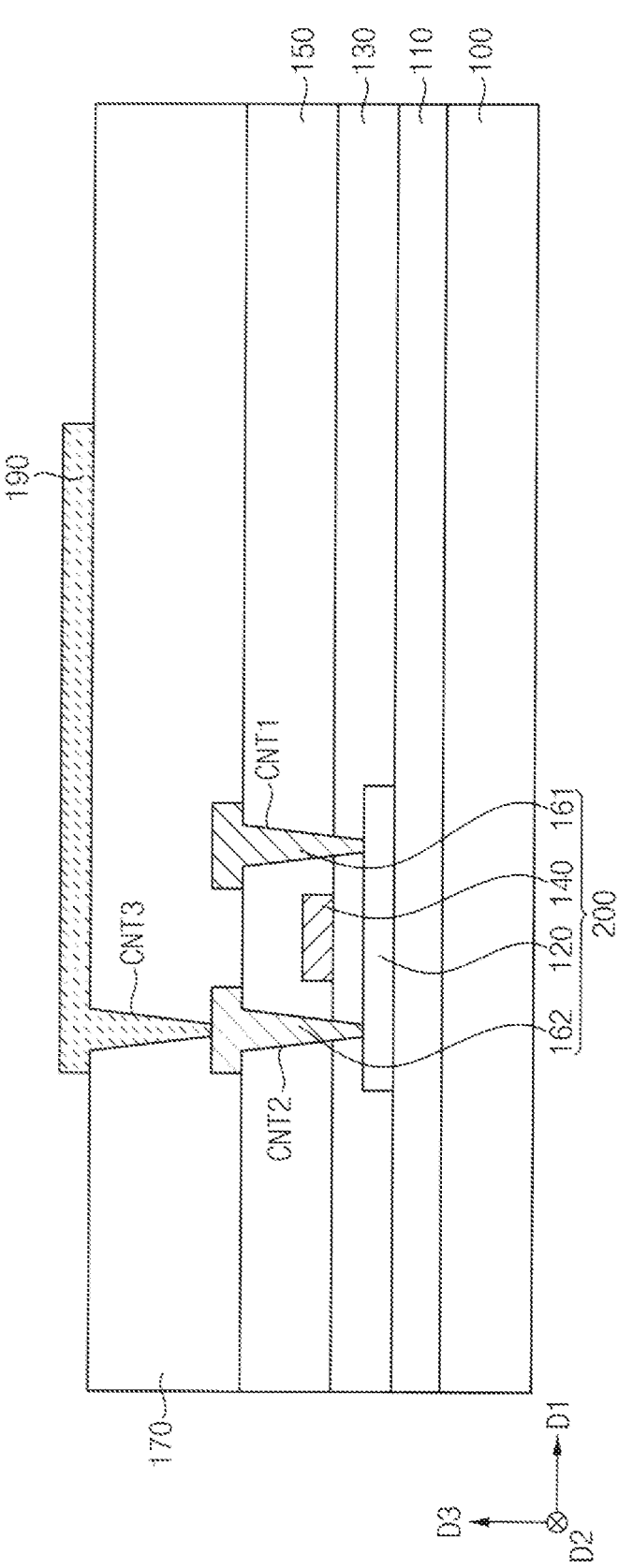

Referring to FIGS. 1, 2, and 4, the buffer layer 110 may be formed (or provided) on the substrate 100 including the display area DA and the peripheral area PA. The substrate 100 may include a transparent material or an opaque material. In an embodiment, for example, the substrate 100 may include a transparent resin substrate. In an embodiment, for example, the buffer layer 110 may be formed using silicon oxide, silicon nitride, and the like.

The active layer 120 may be formed in the display area DA, on the buffer layer 110. The active layer 120 may include a metal oxide semiconductor, an inorganic semiconductor, or an organic semiconductor. The active layer 120 may include a source region, a drain region, and a channel region which is positioned between the source region and the drain region.

The gate insulating layer 130 may be formed on the buffer layer 110. The gate insulating layer 130 may cover the active layer 120. In an embodiment, for example, the gate insulating layer 130 may be formed using silicon oxide, silicon nitride, silicon oxide, and the like.

The gate electrode 140 may be formed in the display area DA, on the gate insulating layer 130. The gate electrode 140 may overlap the channel region of the active layer 120. In an embodiment, for example, the gate electrode 140 may be formed using a metal, an alloy, a metal nitride, a conductive metal oxide, a transparent conductive material, and the like.

The interlayer insulating layer 150 may be formed on the gate insulating layer 130. The interlayer insulating layer 150 may cover the gate electrode 140. In an embodiment, for example, the interlayer insulating layer 150 may be formed using silicon oxide, silicon nitride, silicon carbide, and the like.

The first contact hole CNT1 exposing the source region of the active layer 120 to outside the gate insulating layer 130 and the interlayer insulating layer 150, may be formed by removing a first portion of the gate insulating layer 130 and the interlayer insulating layer 150. In addition, the second contact hole CNT2 exposing the drain region of the active layer 120 to outside the gate insulating layer 130 and the interlayer insulating layer 150, may be formed by removing the second portions of the gate insulating layer 130 and the interlayer insulating layer 150. Thereafter, a metal layer (e.g., first metal layer) may be formed on the interlayer insulating layer 150 while filling the first contact hole CNT1 and the second contact hole CNT2. By patterning the metal layer, the source electrode 161 and the drain electrode 162 respectively connected to the source region and the drain region may be formed. In an embodiment, for example, each of the source electrode 161 and the drain electrode 162 may be formed using a metal, an alloy, a metal nitride, a conductive metal oxide, a transparent conductive material, and the like.

Accordingly, the driving element 200 including the active layer 120, the gate electrode 140, the source electrode 161 and the drain electrode 162 may be formed in the display area DA, on the substrate 100.

The planarization layer 170 may be formed on the interlayer insulating layer 150. The planarization layer 170 may cover the source electrode 161 and the drain electrode 162. In an embodiment, the planarization layer 170 may be formed using an organic insulating material. In an embodiment, for example, the planarization layer 170 may be formed using a polyacrylic resin, a polyimide-based resin, an acrylic resin, a phenol resin, and the like.

The third contact hole CNT3 exposing an upper surface of the drain electrode 162 to outside the planarization layer 170, may be formed by removing a portion of the planarization layer 170. Thereafter, a metal layer (e.g., a second metal layer) may be formed on the planarization layer 170 while filling the third contact hole CNT3. By patterning the metal layer, the pixel electrode 190 connected to the drain electrode 162 may be formed. In an embodiment, for example, the pixel electrode 190 may be formed using a metal, an alloy, a metal nitride, a conductive metal oxide, a transparent conductive material, and the like.

Referring to FIG. 5, a photosensitive organic layer 180' may be applied on the planarization layer 170. The photosensitive organic layer 180' may sufficiently cover the pixel electrode 190, such as extending further than an outer edge of the pixel electrode 190. In an embodiment, the photosensitive organic layer 180' may be formed using an organic insulating material. In addition, the photosensitive organic layer 180' may be formed by further using a black pigment or a black dye. In this case, since the photosensitive organic layer 180' may be selectively removed by direct exposure without the need for applying a separate photosensitive layer, a manufacturing process may be simplified. In an embodiment, the photosensitive organic layer 180' may be formed using a negative photosensitive material.

Referring to FIGS. 6, 7, and 8, the pixel defining layer 180 may be formed on the planarization layer 170 and the pixel electrode 190, through the photolithography process.

First, the mask 600 may be positioned on the photosensitive organic layer 180'. In an embodiment, for example, the mask 600 may be a halftone mask or a slit mask. In an embodiment, the mask 600 may be divided into a light blocking portion 601, a first light transmitting portion 602a, a semi-transmitting portion 603, and a second light transmitting portion 602b. The first light transmitting portion 602a may surround the light blocking portion 601, the semi-transmitting portion 603 may surround the first light transmitting portion 602a, and the second light transmitting portion 602b may surround the semi-transmitting portion 603. Each of the first light transmitting portion 602a and the second light transmitting portion 602b may transmit all light, the semi-transmitting portion 603 may transmit a portion of the light, and the light blocking portion 601 may block all light. The first light transmitting portion 602a and the second light transmitting portion 602b may correspond to protrusions of the pixel defining layer 180, the semi-transmitting portion 603 may correspond to an exposed upper surface of the flat portion 181a, and the light blocking portion 601 may correspond to a sidewall of the pixel defining layer 180 which defines the pixel opening at the pixel electrode 190.

Among regions of the photosensitive organic layer 180', a region in which a total thickness of the photosensitive organic layer 180' is removed, a region in which a thickness portion of the photosensitive organic layer 180' remains to define the protrusion portion 181b of the bank portion 181, a region in which a thickness portion of the photosensitive organic layer 180' remains to define the spacer portion 182 of the pixel defining layer 180, and a region in which a thickness portion of the photosensitive organic layer 180' remains to define the upper surface of the bank portion 181 exposed through the mask 600, may be defined by different exposure degrees, respectively.

The pixel opening of the bank portion 181 may be formed by removing all of the photosensitive organic layer 180'

(e.g., the total thickness portion) corresponding to the light blocking portion 601 of the mask 600. Specifically, the photosensitive organic layer 180' corresponding to the light blocking portion 601 of the mask 600 may be removed through development of the photosensitive organic layer 180'. In addition, a first thickness portion of the photosensitive organic layer 180' corresponding to the first light transmitting portion 602*a* of the mask 600 may remain, so that the protrusion portion 181*b* of the bank portion 181 may be formed. A second thickness portion of the photosensitive organic layer 180' corresponding to the second light transmitting portion 602*b* of the mask 600 may remain, so that the spacer portion 182 of the pixel defining layer 180 may be formed. The upper surface of the flat portion 181*a* of the bank portion 181 may be exposed between protrusions of the pixel defining layer 180, by removing a portion of the photosensitive organic layer 180' corresponding to the semi-transmitting portion 603 of the mask 600 such that a third thickness portion of the photosensitive organic layer 180' remains.

That is, the pixel defining layer 180 including the bank portion 181 including the flat portion 181*a* formed on the planarization layer 170, the protrusion portion 181*b* protruding in the thickness direction (e.g., the third direction D3) from the upper surface of the flat portion 181*a* adjacent to the pixel electrode 190, the bank portion 181 having sidewalls defining the pixel opening exposing a portion of the pixel electrode 190, and the spacer portion 182 protruding in the thickness direction further from the upper surface of the bank portion 181, may be formed by exposing and developing the photosensitive organic layer 180' through the mask 600. In an embodiment, the exposing and developing of the photosensitive organic layer 180' through the mask 600 includes providing light to the photosensitive organic layer 180', and each of the first and second light transmitting portions 602*a* and 602*b* of the mask 600 transmits all of the light, the semi-transmitting portion 603 of the mask 600 transmits a portion of the light, and the light blocking portion 601 of the mask 600 blocks all of the light.

Figure 9:
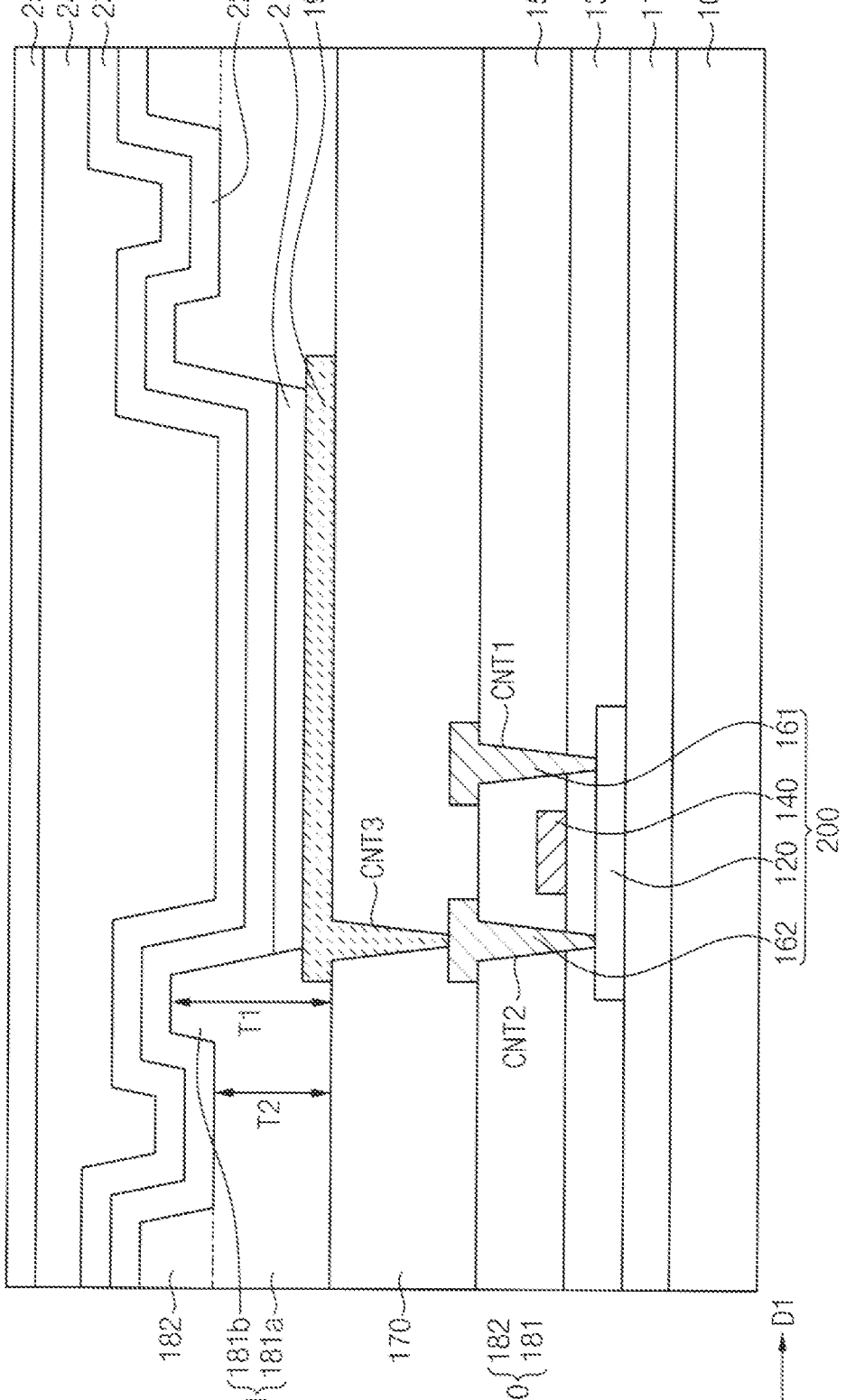

Referring to FIG. 9, the light emitting layer 210 may be formed in the pixel opening, on the pixel electrode 190. The light emitting layer 210 may be formed using at least one of light emitting materials that emit different color lights (e.g., red light, green light, blue light, and the like) according to the sub-pixels.

The common electrode 220 may be formed on the pixel defining layer 180 and the light emitting layer 210. In an embodiment, for example, the common electrode 220 may be formed using a metal, an alloy, a metal nitride, a conductive metal oxide, a transparent conductive material, and the like.

The encapsulation structure 400 may be formed on the common electrode 220. The encapsulation structure 400 may include the first inorganic encapsulation layer 230 formed on the common electrode 220, the organic encapsulation layer 240 formed on the first inorganic encapsulation layer 230, and the second inorganic encapsulation layer 250 formed on the organic encapsulation layer 240. In an embodiment, for example, each of the first inorganic encapsulation layer 230 and the second inorganic encapsulation layer 250 may be formed using an inorganic insulating material having flexibility. The organic encapsulation layer 240 may be formed using a flexible organic insulating material.

Referring back to FIGS. 2 and 3, the light blocking layer 260 may be formed on the second inorganic encapsulation layer 250. A plurality of light blocking patterns of the light blocking layer 260 may overlap solid portions of the pixel defining layer 180. In addition, the solid portions of the light blocking layer 260 which provide the light blocking patterns may defines a plurality of light emission openings corresponding to the light emitting layer 210 provided in plural including a plurality of light emitting layers 210.

The reflection control layer 270 may be formed on the second inorganic encapsulation layer 250. The reflection control layer 270 may cover the light blocking layer 260. In an embodiment, for example, the reflection control layer 270 may be formed using an inorganic insulating material or an organic insulating material. The overcoat layer 280 may be formed on the reflection control layer 270. In an embodiment, for example, the overcoat layer 280 may be formed using an inorganic insulating material or an organic insulating material.

The window member 500 may be disposed on the overcoat layer 280. The window member 500 may serve to protect the substrate 100, the driving element 200, the light emitting element 300, the encapsulation structure 400, and the like. In an embodiment, for example, the window member 500 may be formed using polyimide and the like.

Accordingly, the display device 10 illustrated in FIGS. 1, 2, and 3 may be manufactured.

Figure 10:
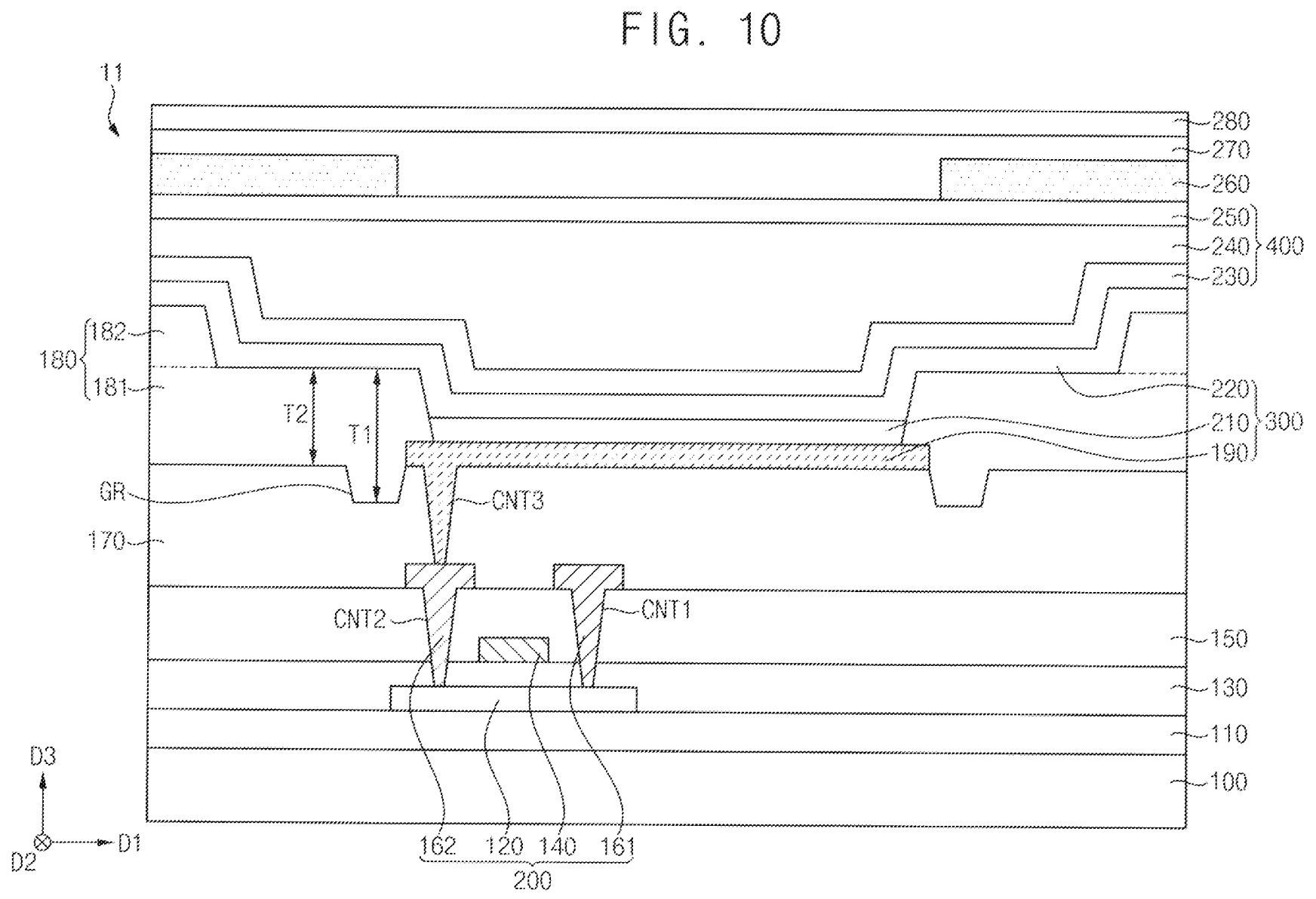

FIG. 10 is a cross-sectional view illustrating a display device 11 according to an embodiment.

Referring to FIG. 10, the display device 11 according to an embodiment of the invention may include the substrate 100, the buffer layer 110, the gate insulating layer 130, the driving element 200, the interlayer insulating layer 150, the planarization layer 170, the light emitting element 300, the pixel defining layer 180, the encapsulation structure 400, the light blocking layer 260, the reflection control layer 270, the overcoat layer 280, and the window member 500. The display device 11 described with reference to FIG. 10 may be substantially the same as or similar to the display device 10 described with reference to FIG. 3 except for the planarization layer 170. Hereinafter, overlapping descriptions will be omitted.

The planarization layer 170 may be disposed on the interlayer insulating layer 150. In an embodiment, the planarization layer 170 may define a groove GR adjacent to the pixel electrode 190. In this case, the bank portion 181 of the pixel defining layer 180 may fill the groove GR. In this case, the bank portion 181 of the pixel defining layer 180 overlapping (or corresponding to) the groove GR may have a flat upper surface. That is, the upper surface of the bank portion 181 that does not overlap the groove GR (e.g., is adjacent to the groove GR) and the upper surface of the bank portion 181 that overlaps the groove GR, may be located at the same level to be coplanar with each other. In other words, the upper surface of the bank portion 181 at the groove GR may not protrude in the thickness direction (e.g., the third direction D3) and in a direction away from the substrate 100. Accordingly, the degree of crosslinking of the bank portion 181 overlapping the groove GR may be improved.

In an embodiment, referring to FIGS. 3 and 10, the flat portion 181*a* of the bank portion 181 may be considered as extending into the groove GR to define a protrusion of the pixel defining layer 180 which protrudes in a direction opposite to the protrusion defined by the spacer portion 182. That is, with respect to the flat portion 181*a,* the pixel defining layer 180 may include protrusions protruding in a same direction (FIG. 3) and/or protrusions protruding in different directions (FIG. 10) to improve the degree of crosslinking of the pixel defining layer 180 at a region adjacent to the light emission opening. That is, a total thickness of the pixel defining layer 180 at a first location which is adjacent to the light emission opening is increased by a protrusion, as compared to a total thickness of the pixel defining layer 180 at a second location further from the light emission opening than the first location.

In an embodiment, a first thickness T1 from the upper surface of the planarization layer 170 at the groove GR to the upper surface of the bank portion 181 at the groove GR, may be greater than a second thickness T2 from the upper surface of the planarization layer 170 to the upper surface of the bank portion 181 in the cross-sectional view. That is, the first thickness T1 of the bank portion 181 overlapping the groove GR may be greater than the second thickness T2 of the bank portion 181 not overlapping the groove GR (e.g., spaced apart from the groove GR) and further from the pixel electrode 190 than the groove GR.

FIGS. 11, 12, 13, 14, and 15 are cross-sectional views illustrating a method of manufacturing the display device 11 of FIG. 10. Hereinafter, a description overlapping with the manufacturing method of the display device 10 described with reference to FIGS. 4, 5, 6, 7, 8, and 9 will be omitted.

Figure 11:
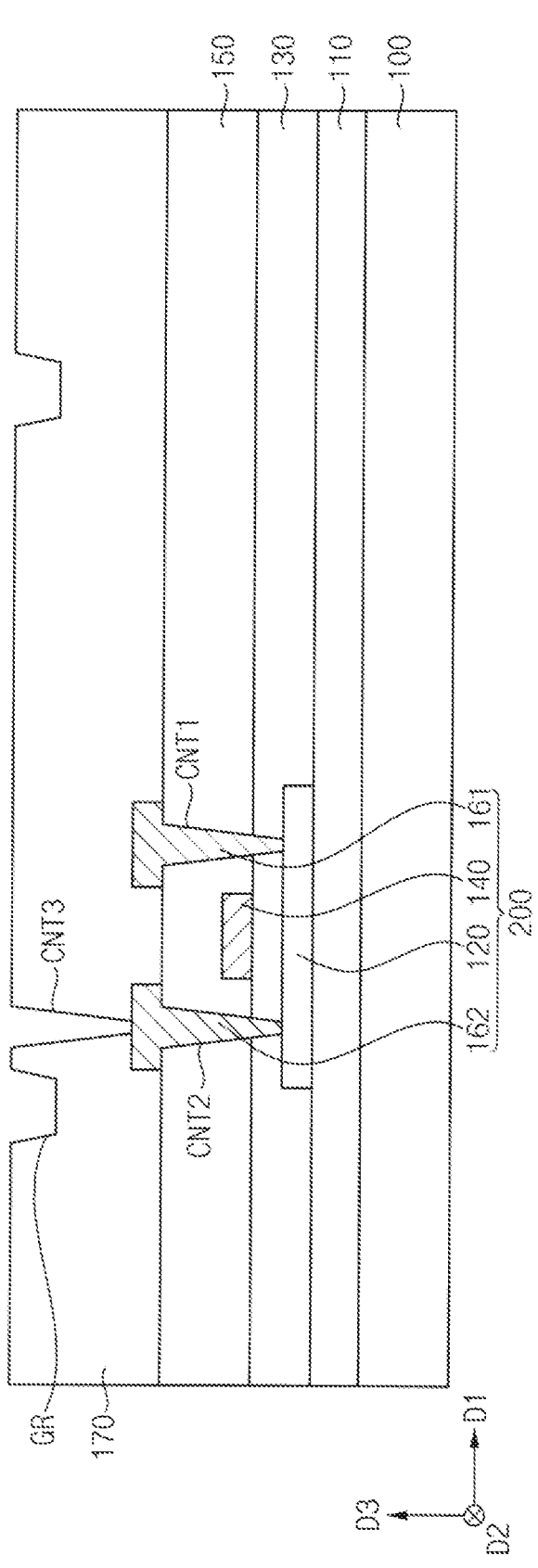

Referring to FIGS. 1, 2 and 11, the buffer layer 110, the active layer 120, the gate insulating layer 130, the gate electrode 140, the interlayer insulating layer 150, the source electrode 161 and the drain electrode 162 may be sequentially formed on the substrate 100. Accordingly, the driving element 200 including the active layer 120, the gate electrode 140, the source electrode 161, and the drain electrode 162 may be formed in the display area DA, on the substrate 100.

The planarization layer 170 may be formed on the interlayer insulating layer 150. The planarization layer 170 may cover the source electrode 161 and the drain electrode 162. In an embodiment, the planarization layer 170 may be formed using an organic insulating material. In this case, since the planarization layer 170 may be selectively removed by direct exposure without the need for applying a separate photosensitive layer, a manufacturing process may be simplified. The planarization layer 170 may be formed using a positive photosensitive material.

The groove GR adjacent to the pixel electrode 190 and the third contact hole CNT3 which is closer to the pixel electrode 190 than the groove GR and exposes the upper surface of the drain electrode 162 may be formed through a photolithography process. Specifically, the groove GR adjacent to the pixel electrode 190 and the third contact hole CNT3 which exposes the upper surface of the drain electrode 162 to outside the planarization layer 170 may formed by removing a portion of the planarization layer 170 through a halftone mask or a slit mask.

Figure 12:
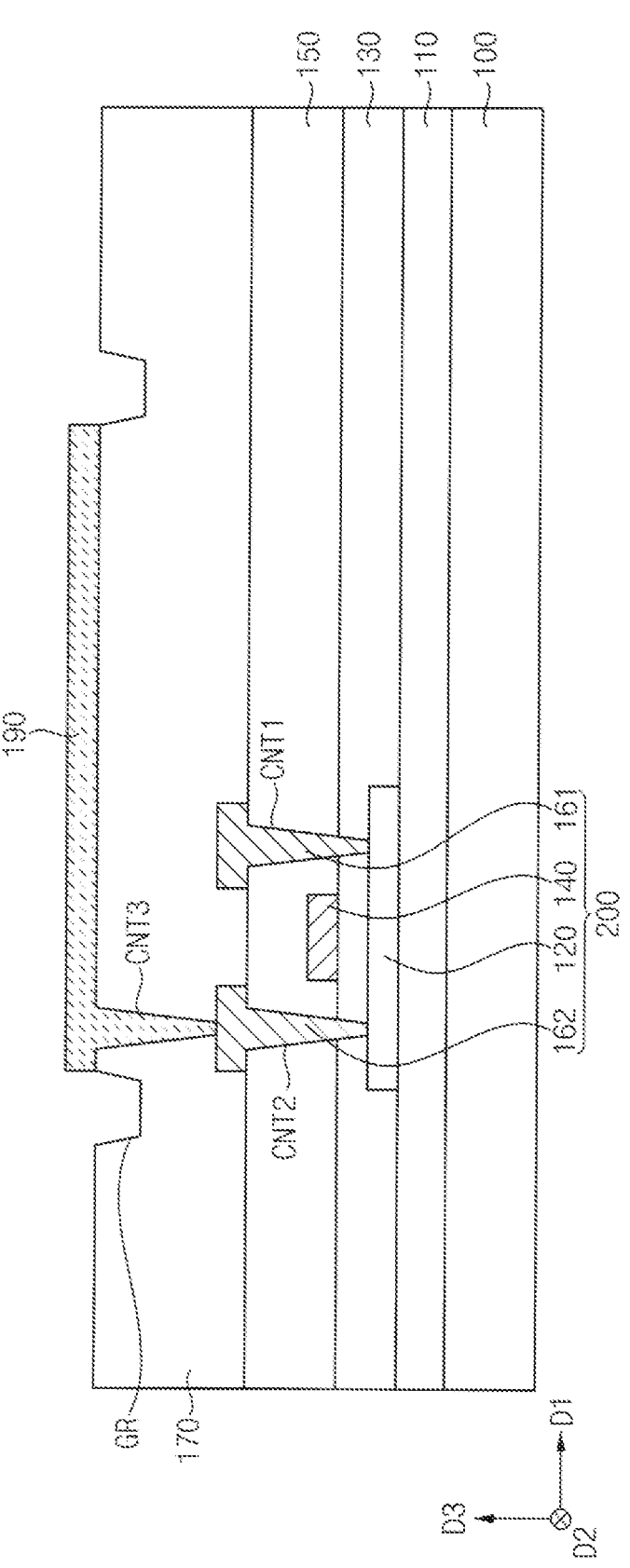

Referring to FIG. 12, a metal layer may be formed on the planarization layer 170 while filling the third contact hole CNT3. The pixel electrode 190 connected to the drain electrode 162 may be formed by patterning the metal layer.

Figure 13:
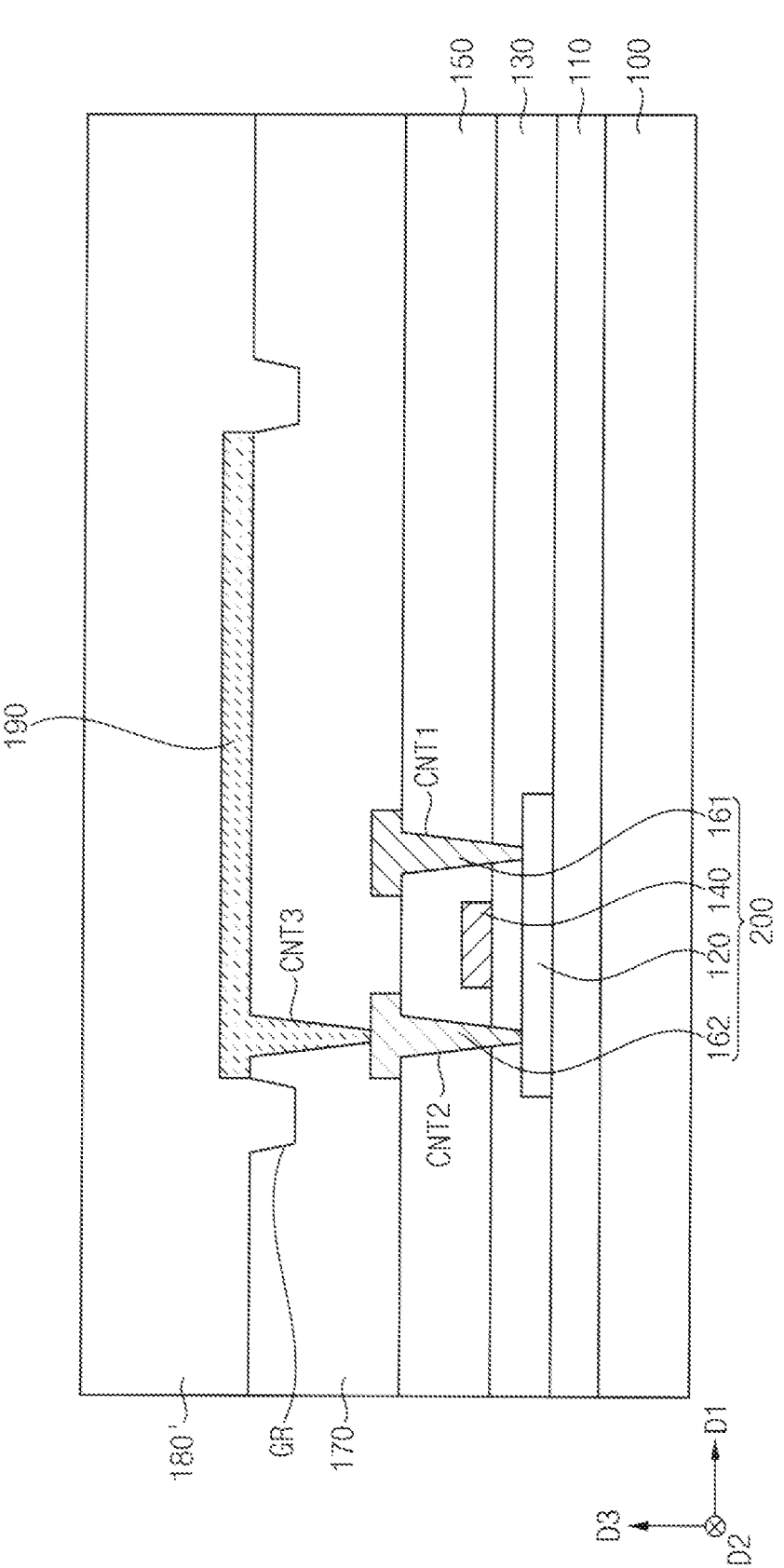
Figure 14:
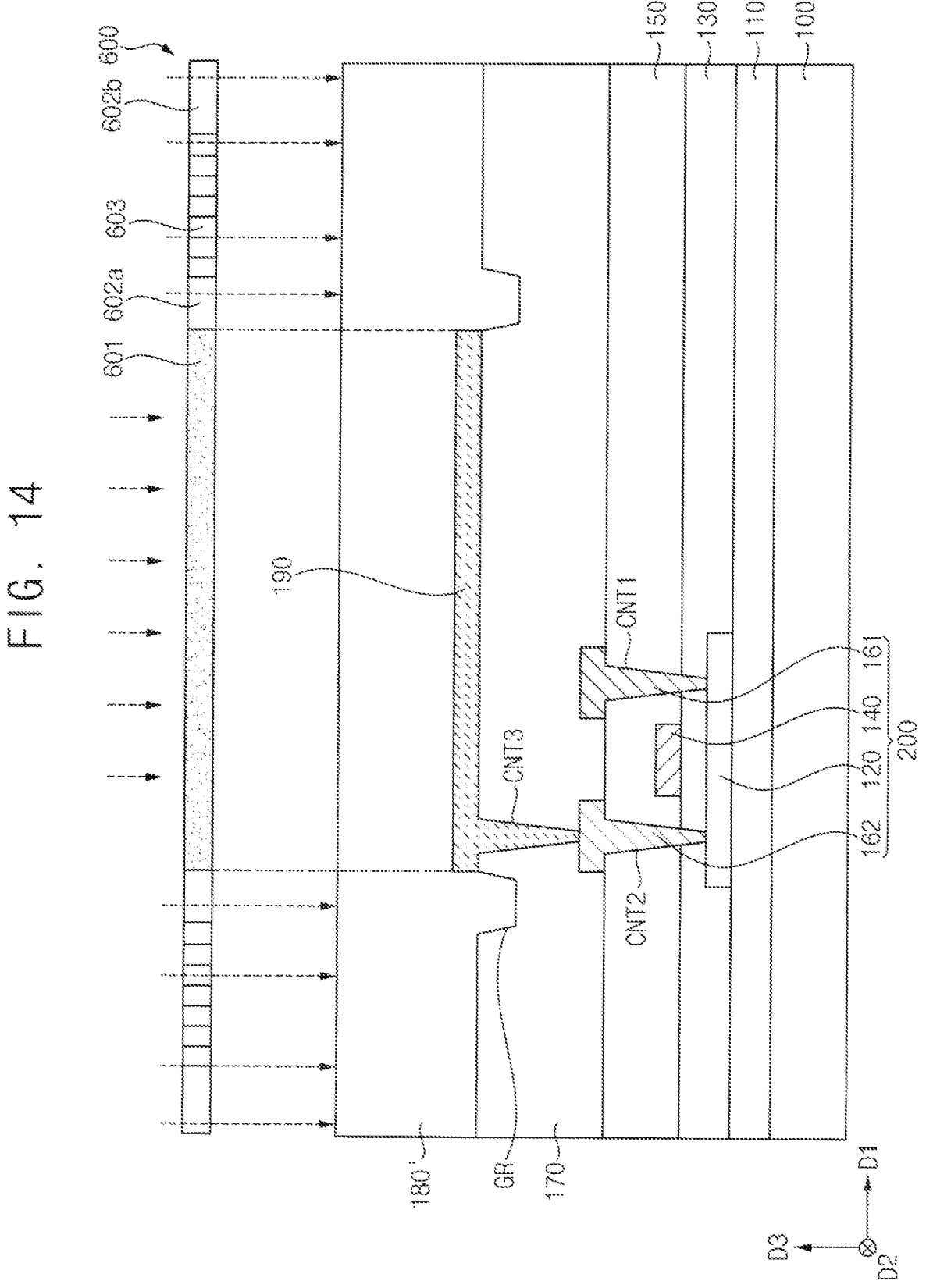
Figure 15:
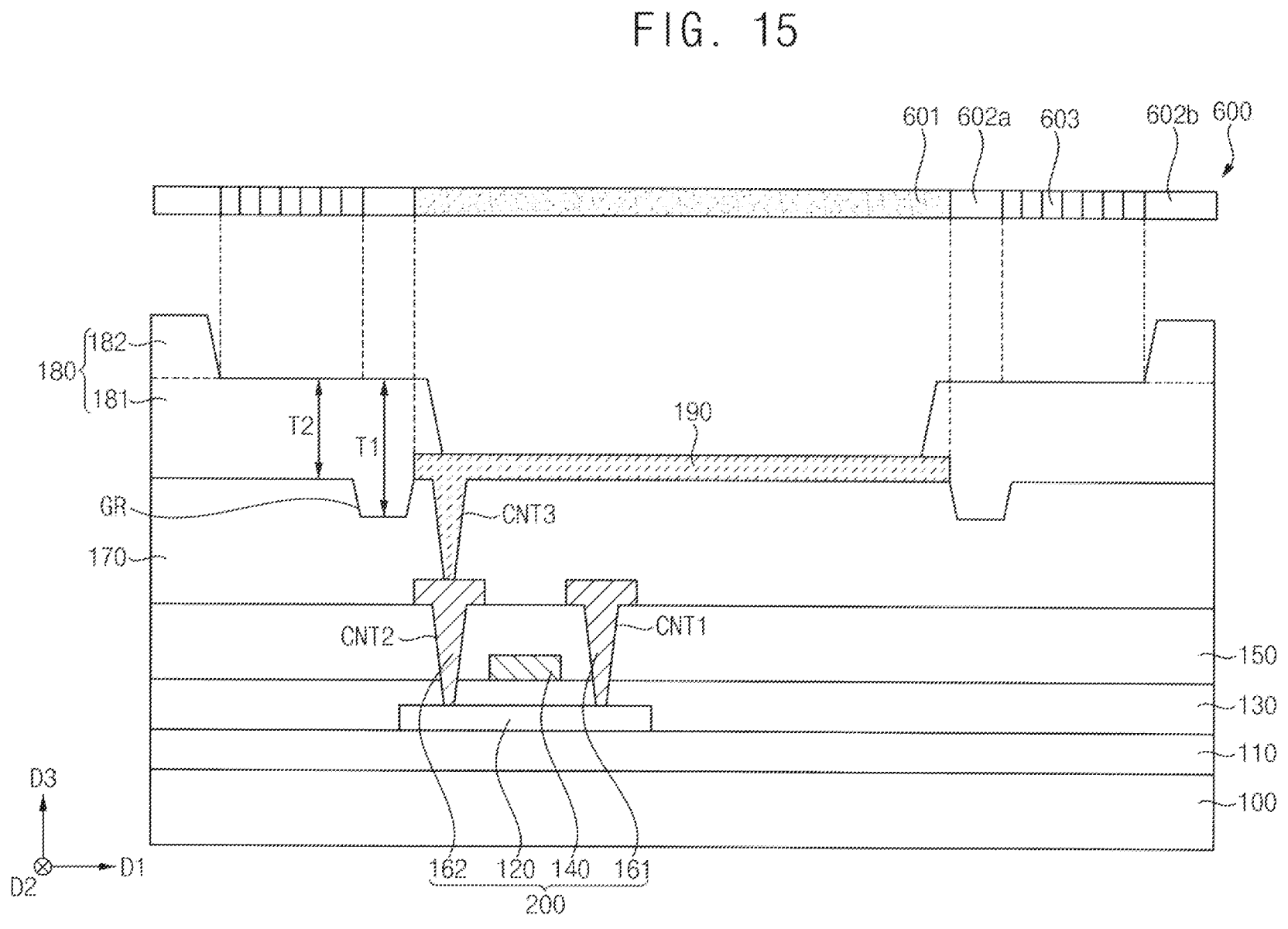

Referring to FIG. 13, the photosensitive organic layer 180' may be coated on the planarization layer 170. The photosensitive organic layer 180' may sufficiently cover the pixel electrode 190. The photosensitive organic layer 180' may fill the groove GR of the planarization layer 170. In an embodiment, the photosensitive organic layer 180' may be formed using an organic insulating material. In addition, the photosensitive organic layer 180' may be formed by further using a black pigment or a black dye. In this case, since the photosensitive organic layer 180' may be selectively removed by direct exposure without the need for applying a separate photosensitive layer, the manufacturing process may be simplified. In an embodiment, the photosensitive organic layer 180' may be formed using a negative photosensitive material Referring to FIGS. 14 and 15, the pixel defining layer 180 may be formed on the planarization layer 170 and the pixel electrode 190, through a photolithography process.

First, the mask 600 may be positioned on the photosensitive organic layer 180'. In an embodiment, the mask 600 may be divided into the light blocking portion 601, the first light transmitting portion 602a, the semi-transmitting portion 603, and the second light transmitting portion 602b. Each of the first light transmitting portion 602a and the second light transmitting portion 602b may transmit all light, the semi-transmitting portion 603 may transmit a portion of the light, and the light blocking portion 601 may block all light.

A region of the photosensitive organic layer 180' which is completely removed to define the pixel electrode 190 is exposed to outside the photosensitive organic layer 180', a region of the photosensitive organic layer 180' at which a thickness portion remains to define the bank portion 181 of the pixel defining layer 180, and a region of the photosensitive organic layer 180' at which a thickness portion remains to define the spacer portion 182 of the pixel defining layer 180 may be exposed to different degrees, via the mask 600, respectively.

The pixel opening of the bank portion 181 may be formed by removing all of the photosensitive organic layer 180' corresponding to the light blocking portion 601 of the mask 600. Specifically, the photosensitive organic layer 180' corresponding to the light blocking portion 601 of the mask 600 may be removed through development, such as via the mask 600. In addition, the photosensitive organic layer 180' corresponding to the first light transmitting portion 602a and the semi-transmitting portion 603 of the mask 600 may remain, so that the bank portion 181 may be formed. In this case, the first light transmitting portion 602a may correspond to the photosensitive organic layer 180' overlapping the groove GR, and the semi-transmitting portion 603 may correspond to the photosensitive organic layer 180' not overlapping the groove GR (e.g., adjacent to or extending from the groove GR in a direction along the planarization layer 170). The photosensitive organic layer 180' corresponding to the second light transmitting portion 602b of the mask 600 may remain, so that the spacer portion 182 of the pixel defining layer 180 may be formed.

That is, the pixel defining layer 180 including the bank portion 181 having the pixel opening exposing a portion of the pixel electrode 190, and the spacer portion 182 protruding in the thickness direction (e.g., the third direction D3) from the upper surface of the bank portion 181 may be formed by exposing and developing the photosensitive organic layer 180' through the mask 600. In this case, a portion of the bank portion 181 overlapping the groove GR may have a flat upper surface.

Referring back to FIG. 9, the light emitting layer 210 may be formed on the pixel electrode 190, and the common electrode 220 may be formed on the pixel defining layer 180 and the light emitting layer 210.

The encapsulation structure 400 may be formed on the common electrode 220. The encapsulation structure 400 may include the first inorganic encapsulation layer 230 formed on the common electrode 220, the organic encapsulation layer 240 formed on the first inorganic encapsulation layer 230, and the second inorganic encapsulation layer 250 formed on the organic encapsulation layer 240.

Referring back to FIGS. 2 and 3, the light blocking layer 260 may be formed on the second inorganic encapsulation layer 250. The light blocking layer 260 may overlap the pixel defining layer 180. The reflection control layer 270 may be formed on the second inorganic encapsulation layer 250. The reflection control layer 270 may cover the light blocking layer 260. The overcoat layer 280 may be formed on the reflection control layer 270, and a window member 500 may be disposed on the overcoat layer 280.

Accordingly, the display device 11 illustrating in FIG. 10 may be manufactured.

Figure 16:
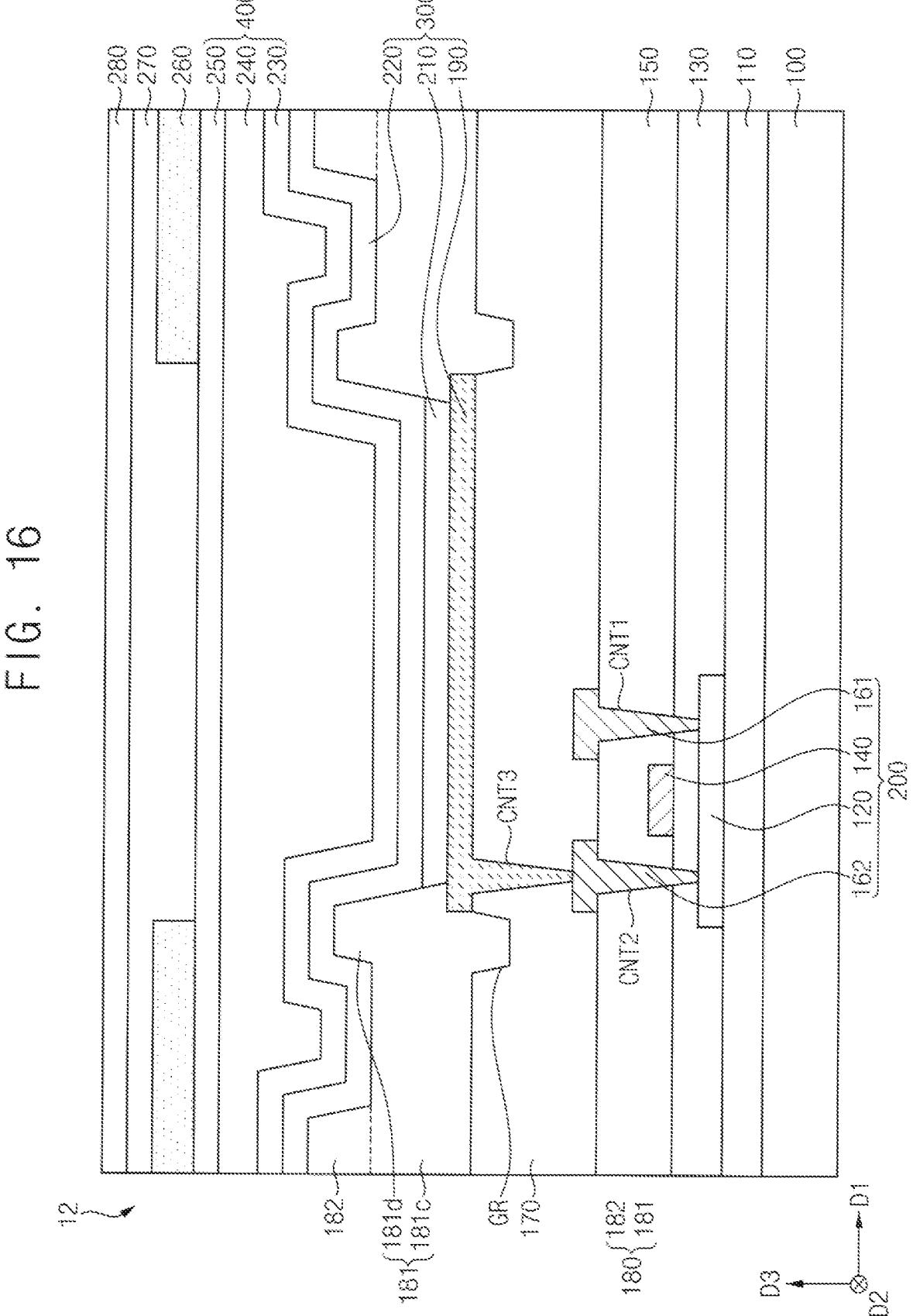
FIG. 16 is a cross-sectional view illustrating a display device according to an embodiment.

FIG. 16 is a cross-sectional view illustrating a display device 12 according to an embodiment.

Referring to FIG. 16, the display device 12 according to an embodiment of the invention may include the substrate 100, the buffer layer 110, the gate insulating layer 130, the driving element 200, the interlayer insulating layer 150, the planarization layer 170, the light emitting element 300, the pixel defining layer 180, the encapsulation structure 400, the light blocking layer 260, the reflection control layer 270, the overcoat layer 280, and the window member 500. The display device 12 described with reference to FIG. 16 may be substantially the same as or similar to the display device 11 described with reference to FIG. 9 except for the bank portion 181. Hereinafter, overlapping descriptions will be omitted.

The planarization layer 170 may be disposed on the interlayer insulating layer 150. In an embodiment, for example, the planarization layer 170 may include an inorganic insulating material or an organic insulating material. In an embodiment, the planarization layer 170 may have or define the groove GR adjacent to the pixel electrode 190.

The pixel defining layer 180 may be disposed on the planarization layer 170. As described above, the pixel defining layer 180 may include the bank portion 181 disposed on the planarization layer 170 and defining the pixel opening exposing a portion of the pixel electrode 190, and the spacer portion 182 as a first protrusion of the pixel defining layer 180 which protrudes in the thickness direction (e.g., the third direction D3) from the upper surface of the bank portion 181. In this case, the bank portion 181 of the pixel defining layer 180 may fill the groove GR.

In an embodiment, the bank portion 181 may include a flat portion 181c disposed on the planarization layer 170, a protrusion portion 181d protruding in the thickness direction from an upper surface of the flat portion 181c overlapping the groove GR to define a second protrusion of the pixel defining layer 180, and a portion protruding into the groove GR to define a third protrusion of the pixel defining layer 180. That is, the pixel defining layer 180 may include two protrusions adjacent to the light emission opening and extending from the flat portion 181a in opposite directions from each other.

Figure 17:
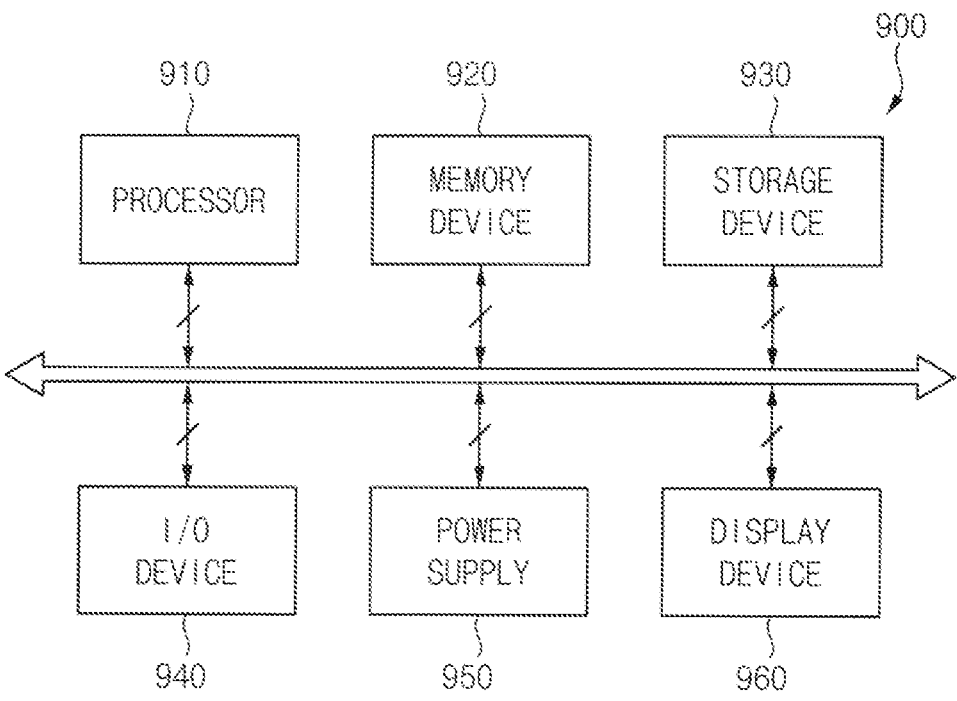
FIG. 17 is a block diagram illustrating an electronic device including the display device of FIG. 1.
Figure 18:
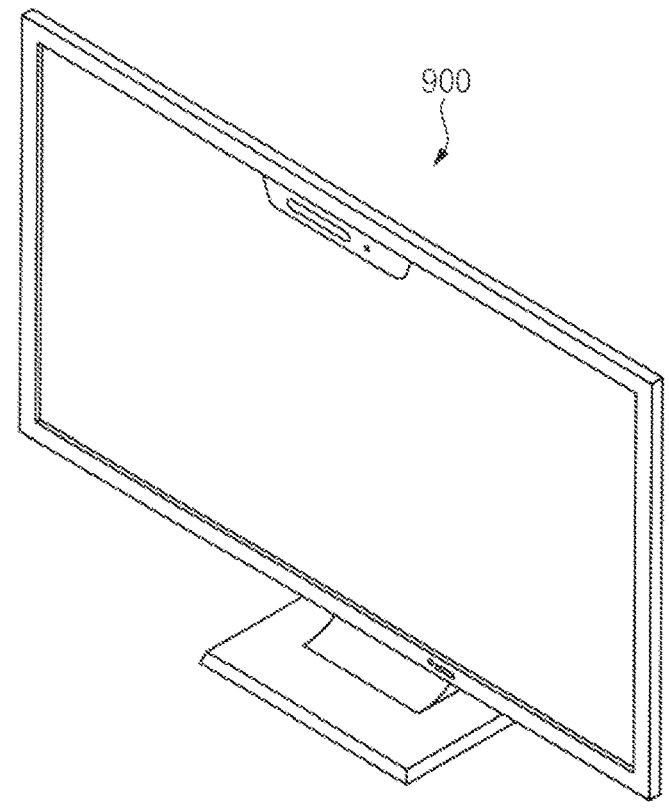
FIG. 18 is a diagram illustrating an embodiment in which the electronic device of FIG. 17 is implemented as a television.
Figure 19:
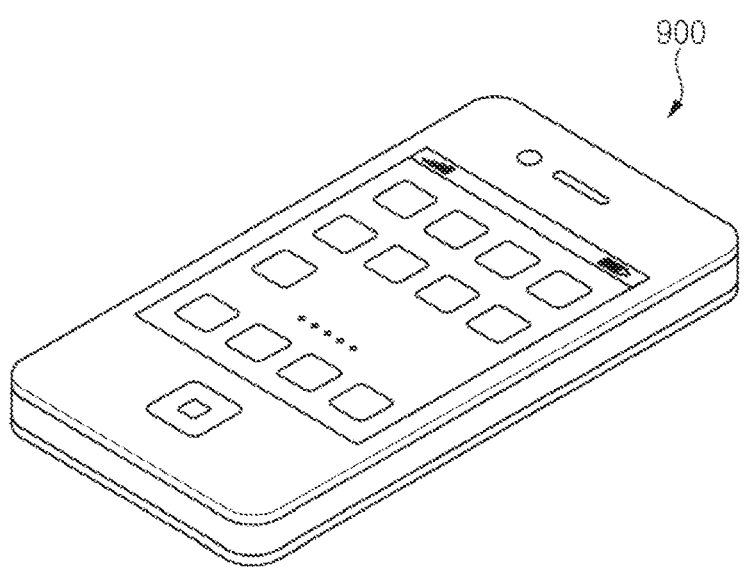
FIG. 19 is a diagram illustrating an embodiment in which the electronic device of FIG. 17 is implemented as a smartphone.

FIG. 17 is a block diagram illustrating an electronic device 900 including the display device 10 of FIG. 1. FIG. 18 is a diagram illustrating an example in which the electronic device 900 of FIG. 17 is implemented as a television. FIG. 19 is a diagram illustrating an example in which the electronic device 900 of FIG. 17 is implemented as a smartphone.

Referring to FIGS. 17, 18 and 19, in an embodiment, the electronic device 900 may include a processor 910, a memory device 920, a storage device 930, an input/output ("I/O") device 940, a power supply 950 and a display device 960. In this case, the display device 960 may correspond to the display device 10 described with reference to FIGS. 1, 2, and 3. The electronic device 900 may further include various ports capable of communicating with a video card, a sound card, a memory card, a USB device, and the like.

In an embodiment, as illustrated in FIG. 18, the electronic device 900 may be implemented as a television. In an embodiment, as illustrated in FIG. 19, the electronic device 900 may be implemented as a smart phone. However, embodiments are not limited thereto, in various embodiments, the electronic device 900 may be implemented as a cellular phone, a video phone, a smart pad, a smart watch, a tablet personal computer ("PC"), a car navigation system, a computer monitor, a laptop, a head disposed (e.g., mounted) display ("HMD"), or the like.

The processor 910 may perform various computing functions. In an embodiment, the processor 910 may be a microprocessor, a central processing unit ("CPU"), an application processor ("AP"), or the like. The processor 910 may be coupled to other components via an address bus, a control bus, a data bus, or the like. The processor 910 may be coupled to an extended bus such as a peripheral component interconnection ("PCI") bus.

The memory device 920 may store data for operations of the electronic device 900. In an embodiment, the memory device 920 may include at least one non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, or the like, and/or at least one volatile memory device such as a dynamic random access memory ("DRAM") device, a static random access memory ("SRAM") device, a mobile DRAM device, or the like.

The storage device 930 may include a solid state drive ("SSD") device, a hard disk drive ("HDD") device, a CD-ROM device, or the like. The I/O device 940 may include an input device such as a keyboard, a keypad, a mouse device, a touchpad, a touch-screen, or the like, and an output device such as a printer, a speaker, or the like.

The power supply 950 may provide power for operations of the electronic device 900. The display device 960 may be coupled to other components via the buses or other communication links. In an embodiment, the display device 960 may be included in the I/O device 940.

The present disclosure can be applied to various display devices that may include a display device 10. In an embodiment, for example, the present disclosure can be applied to high-resolution smartphones, mobile phones, smart pads, smart watches, tablet PCs, in-vehicle navigation systems, televisions, computer monitors, notebook computers, and the like.

The foregoing is illustrative of embodiments and is not to be construed as limiting thereof. Although embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. Therefore, it is to be understood that the foregoing is illustrative of various embodiments and is not to be construed as limited to the embodiments disclosed, and that modifications to the disclosed embodiments, as well as other embodiments, are intended to be included within the scope of the appended claims.

What is claimed is:

1. A display device comprising:
a display area including:
   a display element including a pixel electrode; and
   a driving element connected to the display element;
a planarization layer on the driving element; and
a pixel defining layer on the planarization layer and defining an opening corresponding to the pixel electrode of the display element, the pixel defining layer including:
   a bank portion defining the opening and extending from the pixel electrode, the bank portion including:
      a sidewall which defines the opening,
      a flat portion having an upper surface which is furthest from the planarization layer, and
      a first protrusion which defines the sidewall of the bank portion and protrudes further than the upper surface of the flat portion, in a direction away from the planarization layer, the first protrusion being closer to the opening than the flat portion and non-overlapping the pixel electrode; and
      a second protrusion which protrudes from the upper surface of the flat portion of the bank portion, in the direction away from the planarization layer, and is further from the opening than the first protrusion.

2. The display device of claim 1, wherein within the pixel defining layer:
   each of the first protrusion and the second protrusion has an upper surface which is furthest from the planarization layer, and
   the upper surface of the second protrusion further from the opening than the first protrusion, is further from the planarization layer than the upper surface of the first protrusion.

3. The display device of claim 1, wherein the pixel defining layer further includes a black pigment.

4. The display device of claim 1, wherein the pixel defining layer further includes a negative photosensitive material.

5. The display device of claim 1, wherein the planarization layer includes an organic insulating material.

6. The display device of claim 1, wherein the display element further includes:
   a light emitting layer on the pixel electrode; and
   a common electrode on the pixel defining layer and the light emitting layer.

7. The display device of claim 6, further comprising:
   an encapsulation structure on the common electrode and including an organic layer and an inorganic layer;
   a light blocking layer on the encapsulation structure and overlapping the pixel defining layer; and
   a reflection control layer on the encapsulation structure and covering the light blocking layer.

8. An electronic device comprising:
   a display device comprising:
   a display area including:
      a display element including a pixel electrode, and
      a driving element connected to the display element;
   a planarization layer on the driving element and defining a groove which is in the planarization layer and non-overlapping the pixel electrode; and a pixel defining layer on the planarization layer and defining an opening corresponding to the pixel electrode of the display element, the pixel defining layer including:
   a bank portion defining the opening and extending from the pixel electrode, the bank portion including:
      a flat portion having an upper surface which is furthest from the planarization layer and a lower surface which is closest to the planarization layer, and
      a first protrusion which protrudes from the lower surface of the flat portion of the bank portion, in a direction toward the planarization layer, and fills the groove in the planarization layer; and
   a second protrusion which protrudes from the upper surface of the flat portion of the bank portion, in a direction away from the planarization layer, and is further from the opening than the first protrusion.

9. The electronic device of claim 8, wherein within the bank portion, the upper surface of the flat portion at the groove is flat.

10. The electronic device of claim 8, wherein the pixel defining layer further includes a black pigment.

11. The electronic device of claim 8, wherein the pixel defining layer further includes a negative photosensitive material.

12. The electronic device of claim 8, wherein the planarization layer includes an organic insulating material.

13. The electronic device of claim 8, wherein the bank portion further includes a third protrusion which protrudes from the upper surface of the flat portion, in the direction away from the planarization layer, and is further from the opening than both the first protrusion and the second protrusion.

14. The electronic device of claim 8, wherein the display element further includes:
   a light emitting layer on the pixel electrode; and
   a common electrode on the pixel defining layer and the light emitting layer.

15. A method of providing a display device, the method comprising:
   providing a display element including a pixel electrode and a driving element which is connected to the display element, in a display area;
   providing a planarization layer on the driving element; and
   providing a pixel defining layer on the planarization layer and defining an opening corresponding to the pixel electrode of the display element, the pixel defining layer including:
      a bank portion defining the opening and extending from the pixel electrode, the bank portion including:
         a flat portion having an upper surface which is furthest from the planarization layer,
         a first protrusion which protrudes from the upper surface of the flat portion, in a direction away from the planarization layer, and is adjacent to the pixel electrode; and
      a second protrusion which protrudes from the upper surface of the flat portion, in the direction away from the planarization layer, and is further from the opening than the first protrusion,
   wherein the providing of the pixel defining layer includes:

providing a photosensitive organic layer on the planarization layer;

providing a mask facing the photosensitive organic layer, the mask divided into a light blocking portion corresponding to the opening, a first light transmitting portion corresponding to the first protrusion, a semi-transmitting portion corresponding to the upper surface of the flat portion between the first protrusion and the second protrusion, and a second light transmitting portion corresponding to the second protrusion; and providing the pixel defining layer by exposing and developing the photosensitive organic layer through the mask, including:

providing the opening by removing all of the photosensitive organic layer corresponding to the light blocking portion of the mask;

providing the first protrusion by leaving a thickness portion of the photosensitive organic layer which corresponds to the first light transmitting portion of the mask;

providing the second protrusion by leaving a thickness portion of the photosensitive organic layer which corresponds to the second light transmitting portion of the mask; and providing the upper surface of the flat portion which is between the first protrusion and the second protrusion exposed to outside the pixel defining layer, by removing a thickness portion of the photosensitive organic layer which corresponds to the semi-transmitting portion of the mask.

16. The method of claim 15, wherein the exposing and developing of the photosensitive organic layer through the mask includes providing light to the photosensitive organic layer, and each of the first and second light transmitting portions of the mask transmits all of the light, the semi-transmitting portion of the mask transmits a portion of the light, and the light blocking portion of the mask blocks all of the light.

17. The method of claim 15, wherein each of the first protrusion and the second protrusion of the pixel defining layer has an upper surface which is furthest from the planarization layer, and the providing of the pixel defining layer further includes providing the upper surface of the second protrusion further from the planarization layer than the upper surface of the first protrusion.

18. The method of claim 15, wherein the photosensitive organic layer includes a black pigment.

19. The method of claim 15, wherein the photosensitive organic layer includes a negative photosensitive material.

* * * * *